United States Patent
Kang et al.

(10) Patent No.: US 6,845,031 B2
(45) Date of Patent: Jan. 18, 2005

(54) NONVOLATILE FERROELECTRIC MEMORY DEVICE AND METHOD FOR DRIVING THE SAME

(75) Inventors: Hee Bok Kang, Daejon-shi (KR); Hun Woo Kye, Kyonggi-do (KR); Geun Il Lee, Kyonggi-do (KR); Je Hoon Park, Kyonggi-do (KR); Jung Hwan Kim, Seoul (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/326,916

(22) Filed: Dec. 23, 2002

(65) Prior Publication Data

US 2003/0142532 A1 Jul. 31, 2003

(30) Foreign Application Priority Data

Jan. 26, 2002 (KR) ................. 10-2002-0004622

(51) Int. Cl.[7] ................. G11C 7/00
(52) U.S. Cl. ................. 365/145; 365/149; 365/230.03; 365/230.06
(58) Field of Search ................. 365/145, 149, 365/230.09, 230.06

(56) References Cited

U.S. PATENT DOCUMENTS

| | | | |
|---|---|---|---|
| 5,373,463 A | | 12/1994 | Jones, Jr. |
| 5,880,989 A | * | 3/1999 | Wilson et al. ........ 365/145 |
| 5,917,746 A | | 6/1999 | Seyyedy |
| 5,995,406 A | | 11/1999 | Kraus et al. |
| 6,091,624 A | | 7/2000 | Kang |
| 6,097,622 A | | 8/2000 | Shimizu et al. |
| 6,373,743 B1 | | 4/2002 | Chen et al. |
| 6,560,137 B2 | * | 5/2003 | Allen et al. ........ 365/145 |
| 6,639,857 B2 | * | 10/2003 | Kang et al. ........ 365/200 |

FOREIGN PATENT DOCUMENTS

| | | | | | |
|---|---|---|---|---|---|
| JP | 02000195278 A | * | 7/2000 | ........ | G11C/14/00 |
| JP | 02003030977 A | * | 1/2003 | ........ | G11C/11/22 |
| JP | 02003162894 A | * | 6/2003 | ........ | G11C/11/22 |

* cited by examiner

Primary Examiner—Viet Q. Nguyen
(74) Attorney, Agent, or Firm—Piper Rudnick LLP

(57) ABSTRACT

A nonvolatile ferroelectric memory device and a method for driving the same are disclosed, the device and method devised to stabilize the operation processes and reduce the operation time. The nonvolatile ferroelectric memory device includes a cell array block having a plurality of unit cells being controlled by plate lines and wordlines, a plate line driver being positioned on one side of the cell array block to apply a driving signal to the plate lines, a wordline driver being positioned on the other side of the cell array block to apply a driving signal to the wordlines, a plurality of sub bitlines and main bitlines being arranged on the cell array block in the same direction, and switching control blocks controlling signals applied to the sub bitlines and main bitlines.

14 Claims, 19 Drawing Sheets

NONVOLATILE FERROELECTRIC MEMORY DEVICE AND METHOD FOR DRIVING THE SAME

This application claims the benefit of the Korean Application No. P 2002-4622 filed on Jan. 26, 2002, which is hereby incorporated by reference.

BACKGROUND OF THE INVENTION

1. Field of the Invention

The present invention is related to a nonvolatile ferroelectric memory device, and more particularly, to a nonvolatile ferroelectric memory device and a method for driving the same.

2. Discussion of the Related Art

Generally, a nonvolatile ferroelectric memory, i.e., a ferroelectric random access memory (FRAM) has a data processing speed equal to a dynamic random access memory (DRAM) and retains data even in power off states. For this reason, the nonvolatile ferroelectric memory has received much attention as a next generation memory device.

The FRAM and DRAM are memory devices with similar structures, but the FRAM includes a ferroelectric capacitor having a high residual polarization characteristic. The residual polarization characteristic permits data to be maintained even if an electric field is removed.

FIG. 1 illustrates a hysteresis loop of a general ferroelectric memory. As shown in FIG. 1, even if polarization induced by the electric field has the electric field removed, data is maintained at a certain amount (i.e., d and a states) without being erased due to the presence of residual polarization (or spontaneous polarization). A nonvolatile ferroelectric memory cell is used as a memory device by corresponding the d and states to 1 and 0, respectively.

A related art nonvolatile ferroelectric memory will be described with reference to the accompanying drawings.

FIG. 2 is a schematic diagram of a unit cell of a general nonvolatile ferroelectric memory device. As shown in FIG. 2, the related art nonvolatile ferroelectric memory includes a bitline B/L formed in one direction, a wordline W/L formed to cross the bitline, a plate line P/L spaced apart from the wordline in the same direction as the wordline, a transistor T1 with a gate connected to the wordline and a source connected to the bitline, and a ferroelectric capacitor FC1. A first terminal of the ferroelectric capacitor FC1 is connected to a drain of the transistor T1 and a second terminal is connected to the plate line P/L.

In case where the related art nonvolatile ferroelectric memory device includes a plurality of main bitlines and a plurality of sub bitlines connected to the main bitlines, a main bitline load controller is arranged near a sensing amplifier.

FIG. 3A illustrates a timing diagram of a write mode operation of the related art ferroelectric memory and FIG. 3B illustrates a timing diagram of a read mode operation of the related art ferroelectric memory.

During the write mode, an externally applied chip enable signal CSBpad is activated from the high state to the low state. At the same time, if a write enable signal WEBpad is applied from the high state to the low state, the write mode starts. Subsequently, if an address decoding in the write mode starts, a pulse applied to a corresponding wordline is transited from the low state to the high state to select a cell.

A high signal in a certain period and a low signal in a certain period are sequentially applied to a corresponding plate line in a period where the wordline is maintained at the high state. To write a logic value "1" or "0" in the selected cell, a high signal or low signal synchronized with the write enable signal WEBpad is applied to a corresponding bitline.

In other words, a high signal is applied to the bitline, and if the low signal is applied to the plate line in a period where the signal applied to the wordline is high, a logic value "1" is written in the ferroelectric capacitor. On the other hand, a low signal is applied to the bitline, and if the signal applied to the plate line is high, a logic value "0" is written in the ferroelectric capacitor.

The reading operation of data stored in a cell by the above operation of the write mode will now be described.

If an externally applied chip enable signal CSBpad is activated from the high state to the low state, all of bitlines become equipotential to low voltage by an equalizer signal EQ before a corresponding wordline is selected.

Then, the respective bitline becomes inactive and an address is decoded. The low signal is transited to the high signal in the corresponding wordline according to the decoded address so that a corresponding cell is selected.

The high signal is applied to the plate line of the selected cell to destroy data Qs corresponding to the logic value "1" stored in the ferroelectric memory. If the logic value "0" is stored in the ferroelectric memory, the corresponding data Qns is not destroyed.

The destroyed data and the data that is not destroyed are output as different values by the ferroelectric hysteresis loop, so that a sensing amplifier senses the logic value "1" or "0". In other words, if the data is destroyed, the "d" state is transited to an "f" state as shown in the hysteresis loop of FIG. 1. If the data is not destroyed, the "a" state is transited to the "f" state. Thus, if the sensing amplifier is enabled after a set time has elapsed, the logic value "1" is output in case that the data is destroyed while the logic value "0" is output in case that the data is not destroyed.

As described above, after the sensing amplifier outputs data; to recover the original data, the plate line becomes inactive from the high state to the low state in a state that the high signal is applied to the corresponding wordline.

The aforementioned related art nonvolatile ferroelectric memory device has several problems. In a nonvolatile ferroelectric memory device of the related art, during the read mode, data destroyed in the active period after a cell is accessed are restored in the precharge period and during the write mode, new data are written in the precharge period after the cell accessed in the active period. Even though this method works well in a normal operation state, it can cause a great danger when a power supply is unstable. In other words, if the power supply is cut in the long active period, data destroyed by the read operation can not be restored and new data externally input can not be written in a cell either.

SUMMARY OF THE INVENTION

Accordingly, the present invention is directed to a nonvolatile ferroelectric memory device and a method for driving the same that substantially obviate one or more problems due to limitations and disadvantages of the related art.

An object of the present invention is to provide a nonvolatile ferroelectric memory device and a method for driving the same that stabilize processes of restoring or writing data in a cell and also reduce the processing time thereof.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a nonvolatile ferroelectric memory device includes a cell array block, a plate line driver, a wordline driver, a plurality of sub bitlines and main bitlines, and a plurality of switching control blocks. The cell array block has a plurality of unit cells being controlled by plate lines and wordlines. The plate line driver being positioned on one side of the cell array block applies a driving signal to the plate lines. The wordline driver being positioned on the other side of the cell array block applies a driving signal to the wordlines. A plurality of the sub bitlines and main bitlines are arranged on the cell array block in the same direction. The switching control blocks control signals applied to the sub bitlines and main bitlines.

At this time, the wordline driver includes a NAND gate, a NOR gate, a first NMOS transistor, a second NMOS transistor, and a third NMOS transistor. The NAND gate logically calculates a plurality of X-address signals. The NOR gate logically calculates an output signal of the NAND gate and a first wordline control signal. The first NMOS transistor has a source being provided with an output signal of the NOR gate, a gate being provided with a second wordline control signal, and a drain acting as an output terminal. The second NMOS transistor has a gate being connected to the drain of the first NMOS transistor, a source being provided with a third wordline control signal, and a drain being connected to the wordline. The third NMOS transistor has a source being connected to the wordline along with the second NMOS transistor, a gate being provided with an output signal of the NAND gate and a drain being connected to a ground terminal.

In another aspect of the present invention, the wordline driver includes a first NAND gate, an inverter, a first NMOS transistor, a second NMOS transistor, a second NAND gate, and a third NMOS transistor. The first NAND gate logically calculates a plurality of X-address signals. The inverter reverses an output signal of the first NAND gate. The first NMOS transistor has a source being provided with an output signal of the inverter, a gate being provided with a first wordline control signal, and a drain acting as an output terminal. The second NMOS transistor has a gate being connected to the drain of the first NMOS transistor, a source being provided with a second wordline control signal, and a drain being connected to the wordline. The second NAND gate logically calculates an output signal of the inverter and an external pull-down control signal. The third NMOS transistor has a source being connected to the wordline along with the drain of the second NMOS transistor, a gate being provided with an output signal of the second NAND gate, and a drain being connected to a ground terminal.

Also, the switching control block includes first, second and third switching transistors. The first switching transistor controls the connection between the sub bitlines and the main bitlines. The second switching transistor controls pull-up of the sub bitlines. The third switching transistor controls pull-down of the sub bitlines.

A nonvolatile memory device of the present invention further includes a fourth switching transistor having a gate being connected to the sub bitlines, a drain being connected to the main bitlines, and a source being connected to the ground terminal.

A method for driving a nonvolatile ferroelectric memory device according to the present invention, in which the nonvolatile ferroelectric memory device is defined as a selected cell area selected by the activation of a chip selecting signal and an unselected cell area which remains unselected by the inactivation of the chip selecting signal and has a plurality of unit cells being controlled by the plate line and wordline, includes steps of writing "high" data in every unit cell and writing external data only in the cells selected by the chip selecting signal while restoring unselected cells.

In another aspect of the present invention, a method for driving a nonvolatile ferroelectric memory device, in which an active period and a precharge period are repeated, includes steps of accessing particular cells by a write enable signal in the active period, writing "high" data in every cell simultaneously in the active period, and writing external data in the accessed cells and restoring the rest cells in the active period.

As the write enable signal is transited from a low level to a high level, "low" data are written in the accessed cells.

In another aspect of the present invention, a method for driving a nonvolatile ferroelectric memory device, in which an active period and a precharge period are repeated, includes steps of reading data being stored in cells and delivering the data to a sense amplifier in the active period, writing "high" data in every cell in the active period, and restoring "low" data in cells which used to have the "low" data before among the cells of which data were read in the first step.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

A nonvolatile ferroelectric memory device of the present invention is characterized in that a write mode and a read mode are separately operated by a cell array structure having hierarchic bitines. Also, in operation of the write mode as well, cells for operating the write mode and cells for operating only the read mode are classified to be separately operated.

Also, during the read and write modes, it is in an active period not in a precharge period when the data are restored in the cells of which data were read. In case of the read mode, in the active period, cell data are read and then, the extinguished data are shortly restored in their own cells. In case of the write mode, in the active period, particular cells are accessed and then, the extinguished data are restored in the cells where the reading operation was performed and new data are written in the accessed cells.

In other words, the data are restored in every cell in which the read operation was performed within 10 ns in the active period. Then, new data are written in the cells in which the write operation will be performed after a write enable signal /WE is transited from a low level to a high level.

Accordingly, even if a power supply is cut in the active period, the data can normally be restored in the cells where the read operation was performed. Also, the read access time is saved as the data can be read or restored in the cells within the active period during the operation of the read or write mode.

Figure 1:
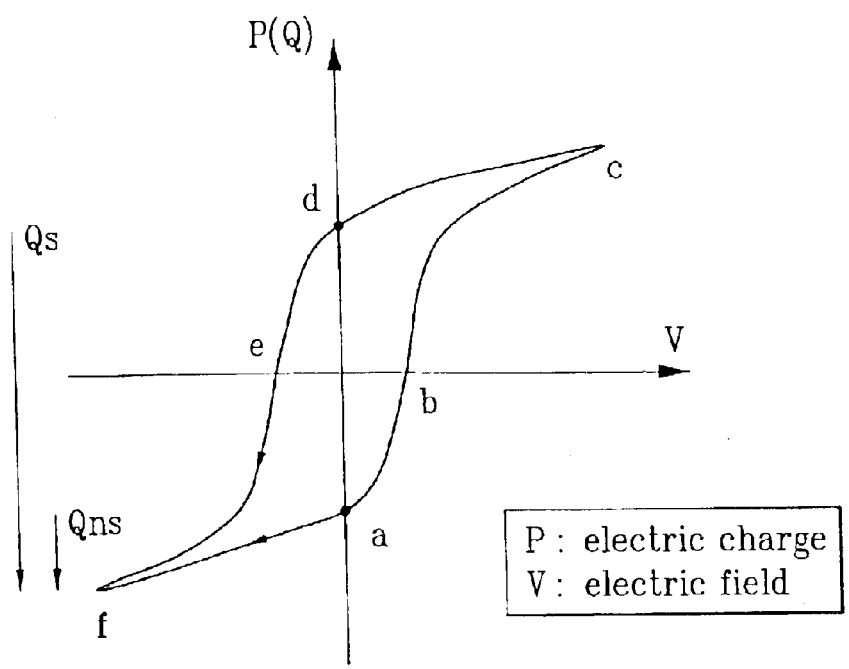
FIG. 1 illustrates a hysteresis loop of a related art ferroelectric.
Figure 2:
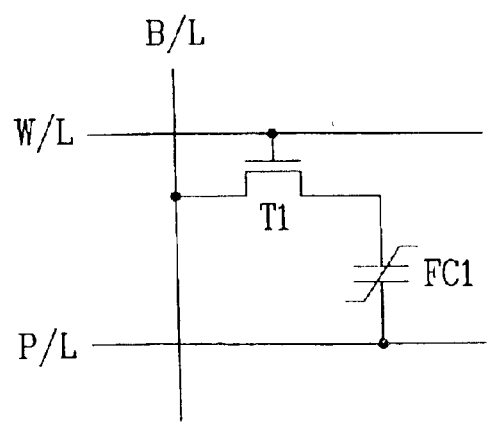
FIG. 2 is a schematic diagram illustrating a unit cell of a nonvolatile ferroelectric memory of the related art.
Figure 3A:
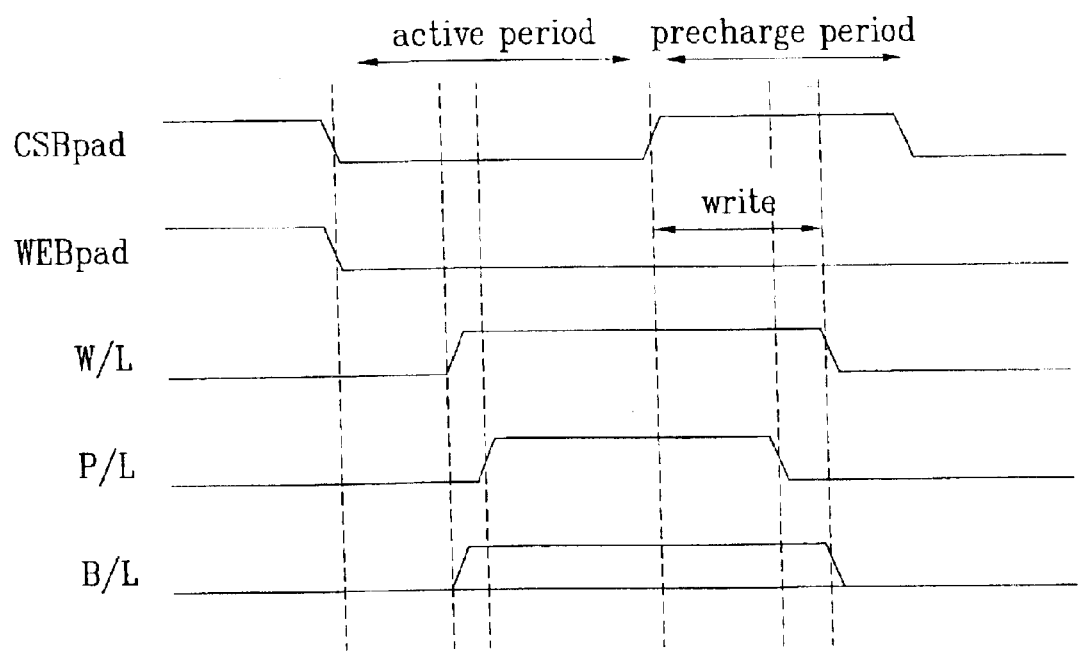
FIG. 3A is a timing diagram illustrating a write mode operation of a nonvolatile ferroelectric memory device of the related art.
Figure 3B:
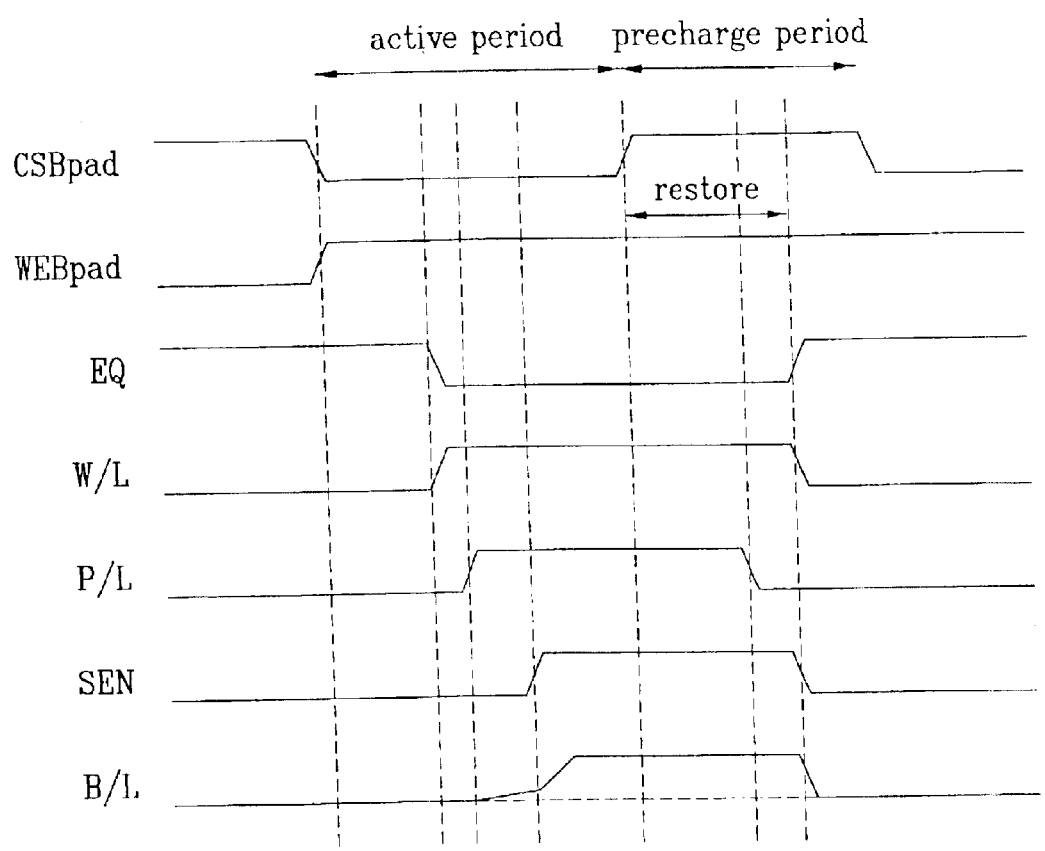
FIG. 3B is a timing diagram illustrating a read mode operation of a nonvolatile ferroelectric memory device of the related art.
Figure 4:
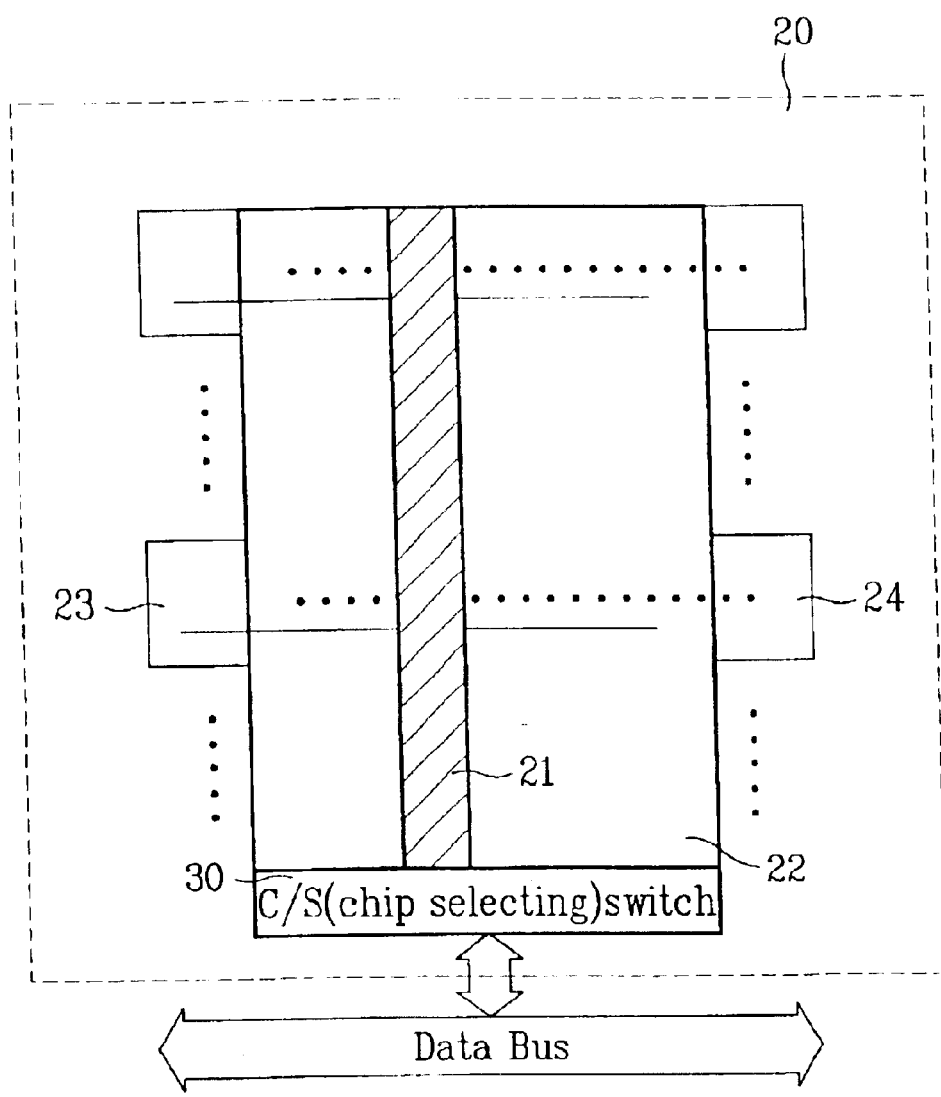
FIG. 4 is a schematic diagram illustrating a cell array block of a nonvolatile ferroelectric memory device in accordance with the present invention.

FIG. 4 is a schematic diagram illustrating a cell array block of a nonvolatile ferroelectric memory device in accordance with the present invention.

As shown in FIG. 4, a cell array block 20 having a plurality of unit cells is defined as a selected cell area 21 and an unselected cell area 22. The selected cell area 21 means cells selected by the activation of a chip selecting signal and the unselected cell area 22 means cells excluded from the selection by inactivation of the chip selecting signal. At this time, the chip selecting signal is controlled by a chip selecting switch 30 being formed on the lower part of the selected cell area 21 and the unselected cell area 22. The chip selecting switch 30 selects cell areas by being provided with an external control signal.

The unit cells of the cell array block 20 are controlled by plate lines PL and wordlines WL. And, the cell array block 20 has a plate line driver 23 and a wordline driver 24 being respectively formed on one and the other sides of the cell array block 20 to apply driving signals to the plate lines PL and wordlines WL. At this time, the wordline driver 24 applies a driving signal to the wordlines of the cell array block 20 and the plate line driver 25 applies a driving signal to the plate lines of the cell array block 20.

Figure 5A:
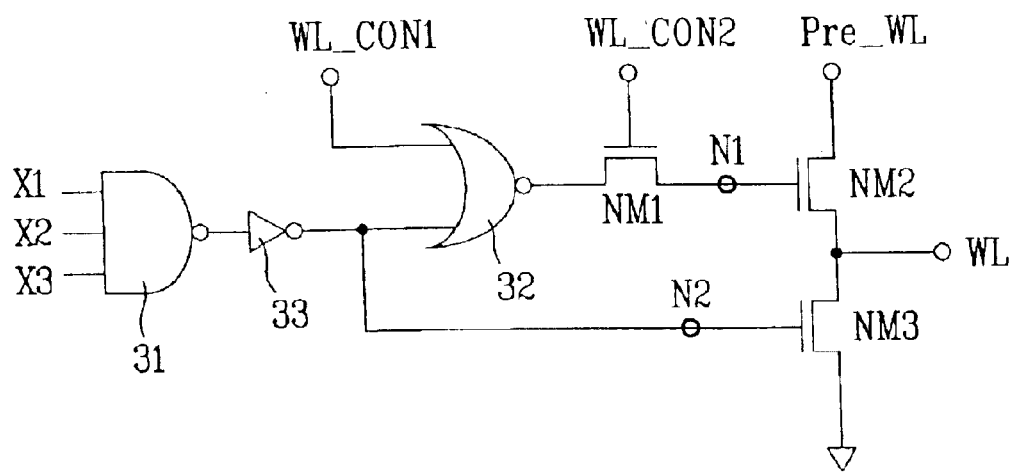
FIG. 5A is a circuit diagram illustrating a wordline driver of a nonvolatile ferroelectric memory device in accordance with the first embodiment of the present invention.
Figure 5B:
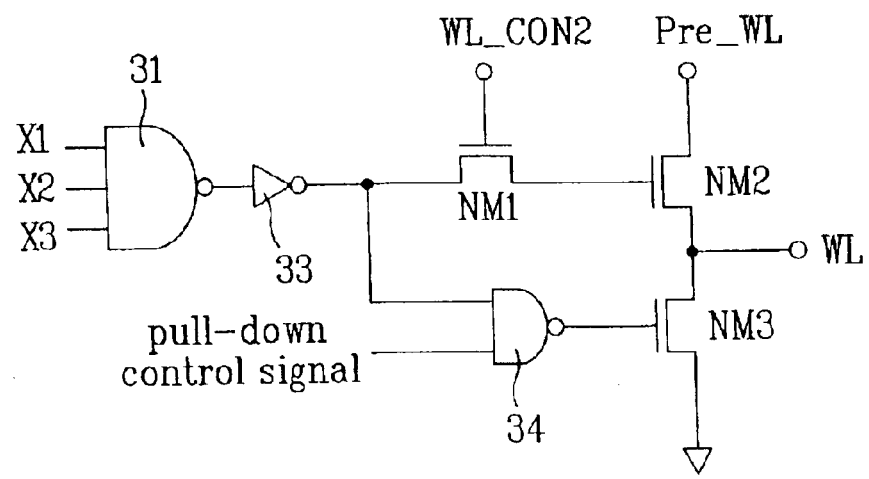
FIG. 5B is a circuit diagram illustrating a wordline driver of a nonvolatile ferroelectric memory device in accordance with the second embodiment of the present invention.

FIGS. 5A and 5B are circuit diagrams illustrating a wordline driver of a nonvolatile ferroelectric memory device in accordance with the present invention.

As shown in FIG. 5A, a wordline driver of a nonvolatile ferroelectric memory device in accordance with the first embodiment of the present invention includes a NAND gate 31, an inverter 33, a NOR gate 32, a first NMOS transistor NM1, a second NMOS transistor NM2, and a third NMOS transistor NM3. The NAND gate 31 being provided with a plurality of X-address signals X1, X2 and X3 logically calculates the signals. The inverter 33 reverses an output signal of the NAND gate 31. The NOR gate 32 being provided with an output signal of the inverter 33 and a first wordline control signal WL_CON1 externally input logically calculates those signals. The first NMOS transistor NM1 has a source being provided with the output signal of the NOR gate 32, a gate being provided with a second wordline control signal WL_CON2 externally input, and a drain being connected to an output terminal (node 1). The second NMOS transistor NM2 has a gate being connected to the drain of the first NMOS transistor NM1, a source being provided with a third wordline control signal Pre_WL, and a drain acting as an output terminal. The third NMOS transistor NM3 has a source being connected to the drain of the second NMOS transistor NM2, a gate being provided with an output signal (node 2) of the inverter 33, and a drain being connected to a ground terminal VSS.

The contact point of the drain of the second NMOS transistor NM2 and the source of the third NMOS transistor NM3 acts as a common output terminal.

As shown in FIG. 5B, a wordline driver of a nonvolatile ferroelectric memory device in accordance with the second embodiment of the present invention includes a first NAND gate 31, an inverter 33, a first NMOS transistor NM1, a second NMOS transistor NM2, a second NAND gate 34, and a third NMOS transistor NM3. The first NAND gate 31 being provided with a plurality of X-address signals X1, X2, and X3 logically calculates the signals. The inverter 33 reverses an output signal of the first NAND gate 31. The first NMOS transistor NM1 has a source being provided with an output signal of the inverter 33, a gate being provided with a second wordline control signal WL_CON2 externally input, and a drain being connected to an output terminal (node 1). The second NMOS transistor NM2 has a gate being connected to the drain of the first NMOS transistor NM1, a source being provided with a third wordline control signal Pre WL, and a drain acting as an output terminal. The second NAND gate 34 being provided with the output signal of the inverter 33 and a pull-down control signal externally input logically calculates those signals. The third NMOS transistor NM3 has a source being connected to the drain of the second NMOS transistor NM2, a gate being provided with the output signals of the second NAND gate 34, and a drain being connected to a ground terminal VSS.

The contact point of the drain of the second NMOS transistor NM2 and the source of the third NMOS transistor NM3 acts as a common output terminal.

An operation of a wordline driver having the above-described structure will be explained below.

A wordline driver is activated as X-address signals X1, X2, and X3 are applied to a NAND gate 31. Then, a second NMOS transistor NM2 is inactivated and the voltage of a node 2 N2 is transited to a low level.

A signal of the node 1 N1 is decided by a first wordline control signal WL_CON1 provided to a NOR gate with two input terminals. That is, if the first wordline control signal $WL_{13}CON1$ is "high", the node 1 N1 signal becomes "low" and if the first wordline control signal WL_CON1 is "low", the node 1 N1 signal becomes "high".

If the first wordline control signal WL_CON1 is "high", the second NMOS transistor NM2 becomes inactivated, thus making the wordline float. Accordingly, the first wordline control signal becomes "high" when it wants to make the first wordline float.

Also, the voltage of the node 1 N1 is decided depending on how high voltage the second wordline control signal WL_CON2 has because the node 1 N1 becomes "high" when the first wordline control signal WL_CON1 is in a "low" level. In other words, if the second wordline control signal WL_CON2 goes up to the VPP level, the node N1 comes to have the same "high" value as the output of a NOR gate 32.

Once VCC is fully provided to the node 1 N1, the second wordline control signal WL_CON2 falls to the VCC level while the voltage of the node 1 N1 is maintained to the same level without any voltage loss by a self-boost process. If the third wordline control signal Pre WL is transited from a low level to the VPP level, the voltage of the node 1 N1 is transited from the VCC level to a VPP and higher level. Accordingly, the VPP voltage of the third wordline control signal Pre_WL is smoothly delivered to the wordline without a voltage loss. Then, the wordline becomes to be in a floating state.

Figure 6:
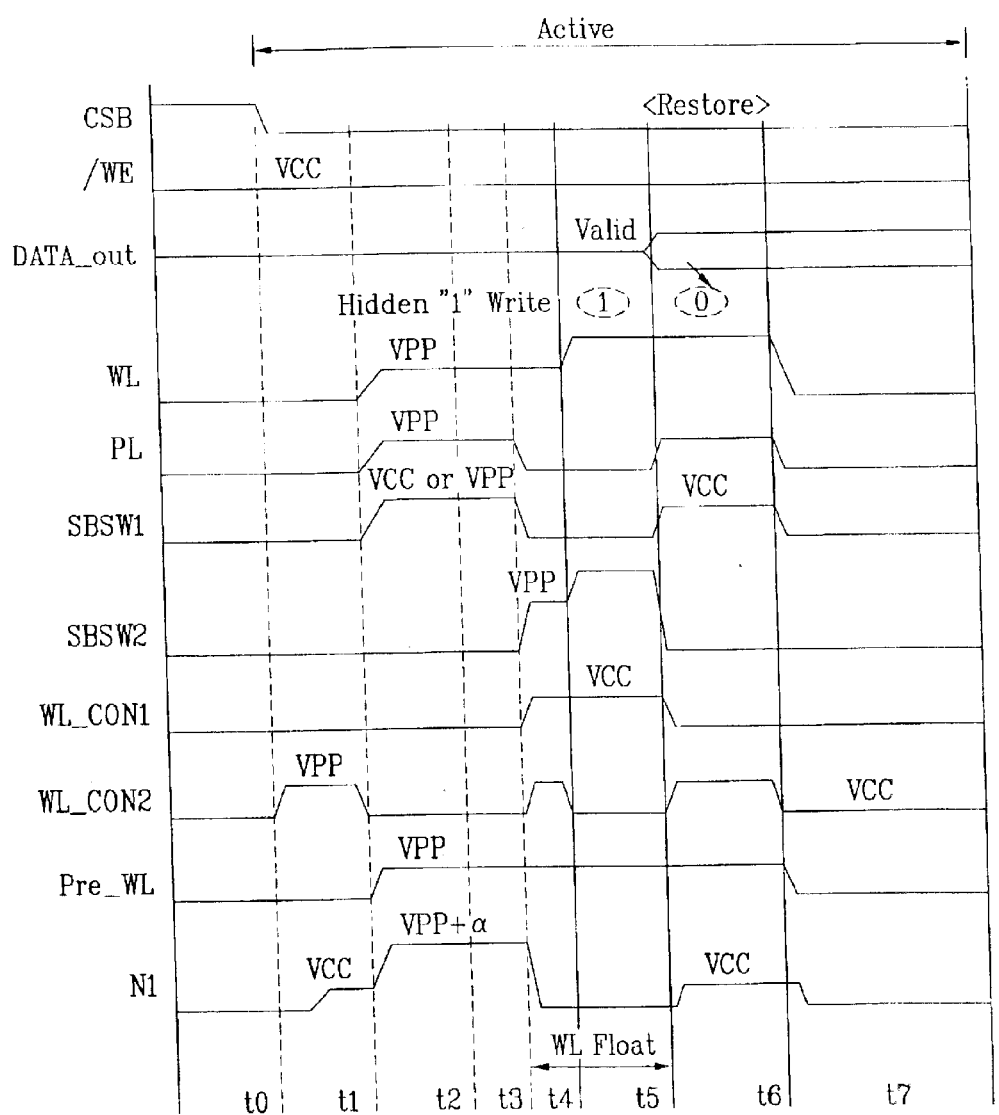
FIG. 6 is a timing diagram illustrating the operation of a wordline driver in accordance with the present invention.

FIG. 6 is a timing diagram illustrating an operation of a wordline driver in accordance with the present invention.

One cycle of a cell operation is defined as an active period and a precharge period. The active period means a period of time when a chip activating signal CSB is in a low level and the precharge period means a period of time when the CSB is in a high level. In other words, the period t0 is the precharge period and the periods t1 to t7 are the successive active periods.

The operation time will be described by dividing the whole operation time to eight periods t0 to t7.

First, VSS is applied to all the signal lines in the period to.

Then, in the period t1, when a second wordline control signal WL_CON2 is transited from the VCC level to the VPP level, the voltage of the node 1 N1 is transited from the VSS level to the VCC level. At this time, the VPP is twice as high as the VCC.

In the period t2, VPP is applied to wordline WL and plate line PL and VCC or VPP is applied to SBSW1 applying line. Also, the second wordline control signal WL_CON2 is transited from the VPP level to the VCC level and a third wordline control signal Pre_WL is transited from the VSS level to the VPP level. Accordingly, a voltage of a VSS and higher level is output from a node 1 N1.

Subsequently, in the period t3, the signals in the period t2 are maintained to the same level so that data being stored in a particular cell can be delivered to a sense amplifier.

Then, in the period t4, the voltage of the wordline is maintained to the VPP level and the voltage of the plate line PL is transited from the VPP level to the VSS level. Also, the voltage of a SBSW1 applying line is transited from the VCC level to the VSS level and the voltage of a SBSW2 applying line is transited from the VSS level to the VPP level.

The voltage of the SBSW2 applying line is transited to the VPP level in the period t4 in advance so that data of logic value "1" can be written in ferroelectric capacitors in the period 5 by making the wordline. WL and SBSW2 applying line have 2VPP by a self-boost process.

In the meantime, the first wordline control signal WL_CON1 is transited form the VSS level to the VCC level and the second wordline control signal WL_CON2 is transited from the VCC level to the VPP level. In this way, the voltage of the node 1 N1 becomes the VSS level and the wordline floats (OFF).

In the period t5 for writing the data of logic value "1" in every cell connected to the wordline, the voltage of the SBSW2 applying line and wordline WL becomes 2VPP by the self-boost process. In this way, VPP is provided to the ferroelectric capacitors provided with a VPP signal of sub bitline SBL.

Then, in the period t6, data of logic value "0" is restored in the cells of which data were read in the period t3, if these cells had the data of logic value "0" before. This is because that a high level voltage is applied to main bitlines MBL. At this time, the wordline voltage is maintained to 2VPP, the plate line voltage to VPP, the SBSW1 applying line voltage to VCC, and the SBSW2 applying line voltage to VSS.

Finally, in the period t7, each voltage level of every signal line is maintained to the level previous to the active period, as it was in the period to.

Figure 7:
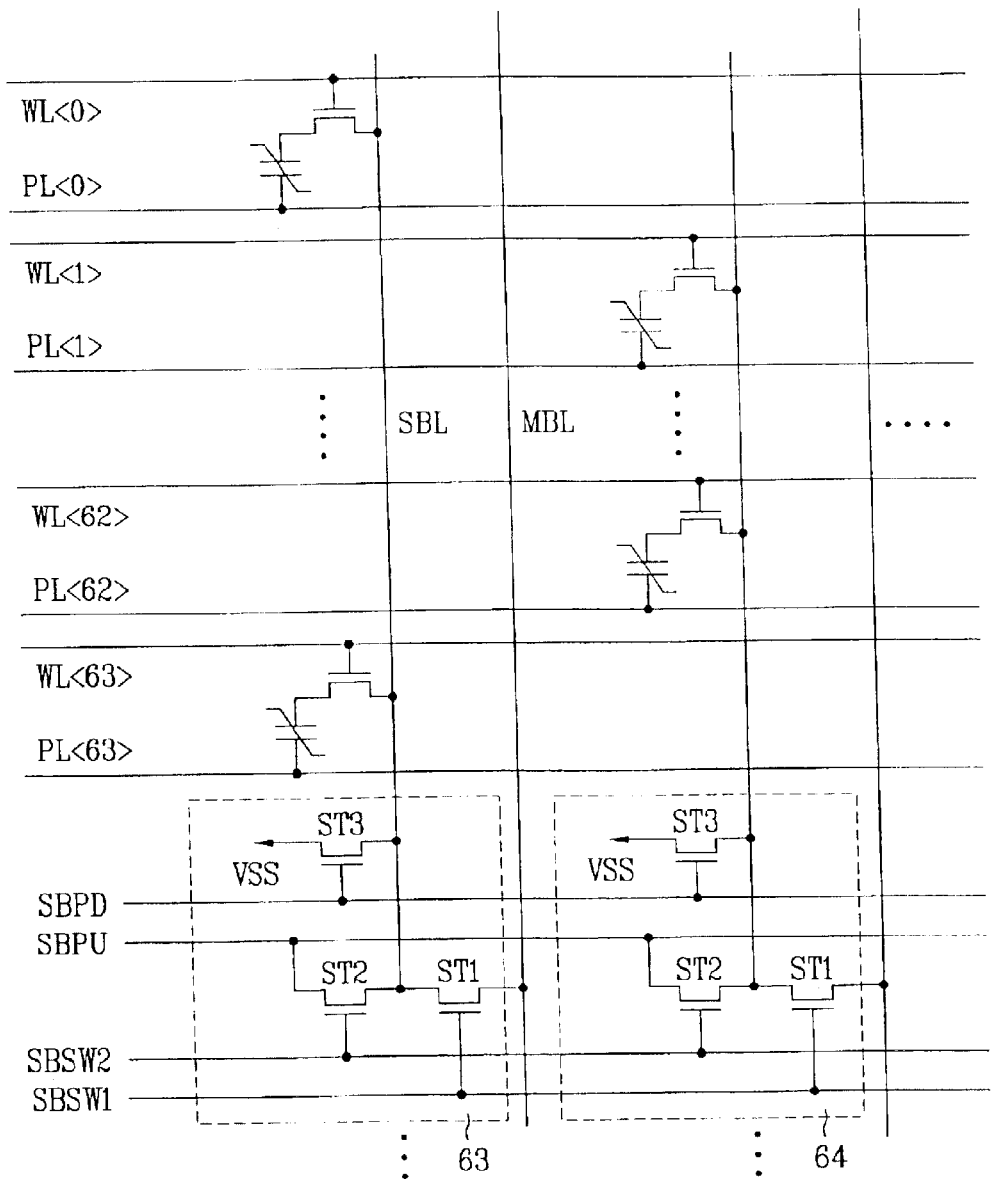
FIG. 7 is a schematic diagram illustrating a structure of a cell array which senses voltage of hierarchic bitlines.

FIG. 7 is a diagram illustrating a sub cell array structure which senses a voltage of hierarchic bitlines.

The cell array is constituted with a plurality of sub cell arrays. As shown in FIG. 7, the cell array includes a plurality of main bitlines MBL being arranged in the same direction with constant intervals and a plurality of sub bitlines SBL being arranged in the same direction as the main bit lines MBL so as to be connected to unit cells in each sub cell array.

Although not shown, one main bit line MBL is selectively connected to a plurality of the sub bitlines SBL. For example, when a cell array is defined as an upper cell array and a lower cell array, one main bitline MBL of a column direction is selectively connected to an upper sub bitline being positioned on the upper cell array or to a lower sub bitline being positioned on the lower sub cell array.

Also, pairs of a wordline and a plate line (WL<0>, PL<0>), . . . , (WL<63>, PL<63>) are arranged to be perpendicular to the main bitlines MBL and sub bitlines SBL.

FIG. 7 illustrates a portion of a sub cell array having 64 rows and 64 columns. Each cell array block has a plurality of cells in a plurality of directions of rows and columns.

A sub bitline pull-down SBPD applying line, first and second sub bitline switch signal SBSW1 and SBSW2 applying lines, and a sub bitline pull-up SBPU applying line are formed in the same direction as the above-mentioned pairs of the wordline and plate line (WL<0>, PL<0>), . . . , (WL<63>, PL<63>).

Also, switching control blocks 63 and 64 are formed corresponding to one main bitline and one sub bitline to decide whether the selected cell is to be connected to the main bitline or to sub bitline and to control a voltage provided to a ferroelectric of the selected cell. The switching control blocks 63 and 64 themselves are controlled by the applying lines of the SBPD, SBSW1, SBSW2, and SBPU.

The switching control blocks 63 and 64 have first, second, and third switching transistors ST1, ST2, and ST3. The first switching transistor ST1 has a gate being connected to the SBSW1 applying line and source and drain electrodes being respectively connected to the main bitline and sub bitline. The second switching transistor ST2 has a gate being connected to the SBSW2 applying line and source and drain electrodes being respectively connected to the sub bitline and SBPU applying line. The third switching transistor ST3 has a gate being connected to the SBPB applying line and source and drain electrodes being respectively connected to the sub bitilne and a ground voltage terminal VSS.

The main bitline can be selectively connected to one of a plurality of the sub bitlines SBL using the switching control blocks 63 and 64. That is, if a first sub bitline switch signal SBSW1 is applied to one of the sub cell arrays to select one sub bitline among a plurality of the sub bitlines, only one sub bitline is connected to the main bitline through the first switching transistor ST1 turned on by the first sub bitline switch signal SBSW1.

Figure 8:
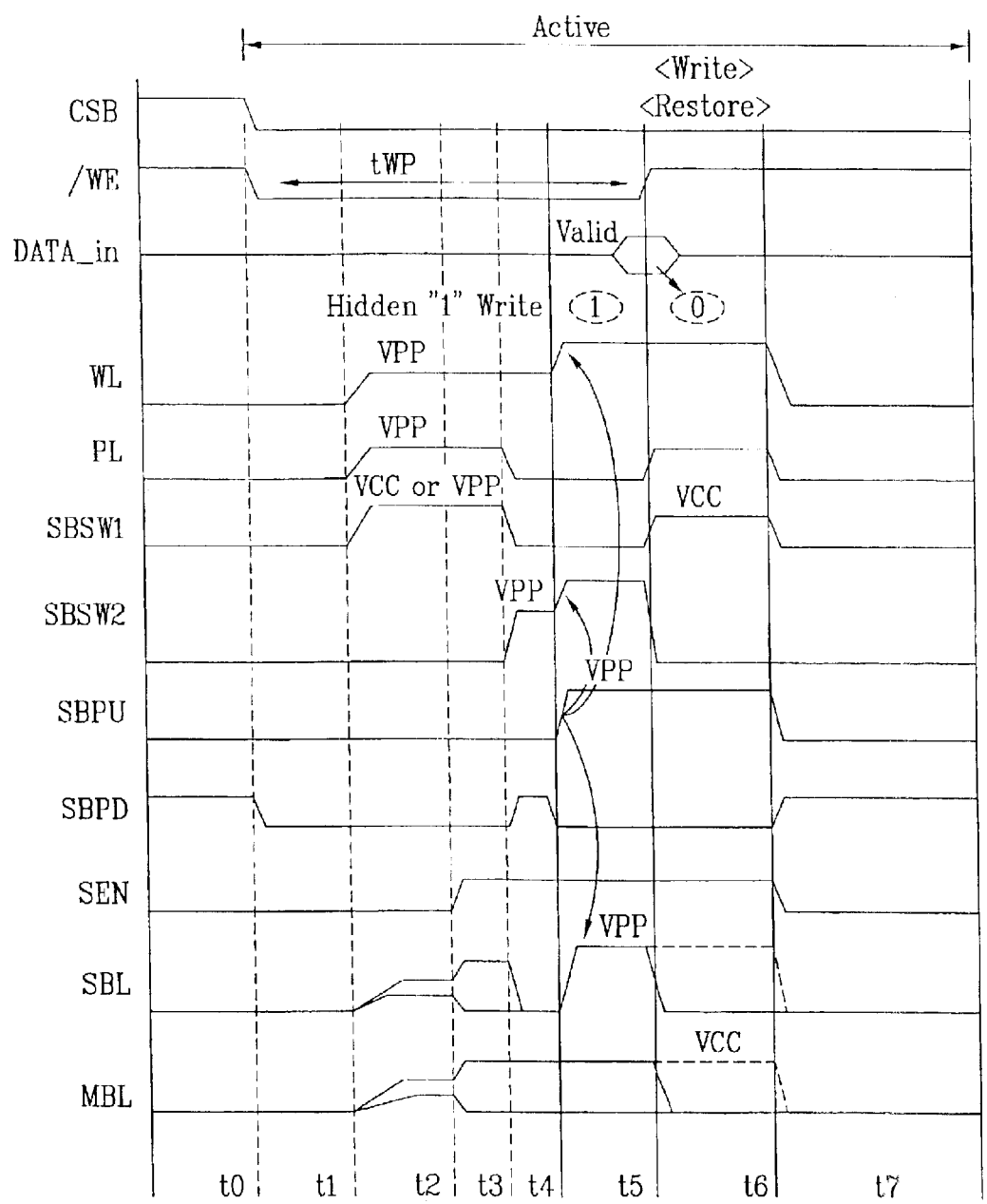
FIG. 8 is a timing diagram illustrating a write mode of the cell array of FIG. 7 during which a write enable signal (/WE) is transited from a low level to a high level in the period t5.

FIG. 8 is a, timing diagram illustrating a write mode in which a write enable signal /WE is transited from a low level to a high level in the period t5.

One cycle of a cell operation is defines as an active period and a precharge period. A CSB is low in the active period and high in the precharge period.

In the related art, data of logic value "0" or "1" are written in the precharge period. In the present invention, however, the data of logic value "0" or "1" are written in the active period to save the precharge time.

The following description is on an operation of writing data of logic value "0" only in a particular cell after writing data of logic value "1" in every cell in an active period of a write mode.

The operation will be described by dividing the whole operation time into eight periods, the periods t0 to t7. The period t0 is a precharge period and the periods t1 to t7 are successive active periods.

In the period t0, VCC is provided to a SBPD applying line to make a voltage provided to sub bitline SBL and main bitline MBL 0V. Also, 0V is provided to a wordline, a plate line, SBSW1 and SBSW2 applying lines, a SBPU applying line, and a SEN applying line.

Then, in the period t1, in which the active period is started, 0V is applied to a CSB applying line and the SBPD applying line.

In the period t2, VPP is applied to the wordline and plate line and VCC or VPP is applied to the SBSW1 applying line. At this time, VPP is twice as high as the VCC. The sub bitline SBL and the main bitline MBL are connected to each other as VCC or VPP is applied to the SBSW1 applying line.

In the period t3, the voltage of the wordline WL and the plate line PL is maintained to VPP. The voltage of the SBSW1 applying line is maintained to the VCC or VPP level until a sense amplifier starts operating. The sense amplifier is provided with VCC to be operated and thus, data being stored in a cell is delivered to the sense amplifier.

In the period t4, the voltage of the wordline is maintained to the VPP level and the voltage of the plate, line PL is transited from VPP to 0V. Also, the voltage of the SBSW1 applying line is transited from VCC or VPP to 0V, the voltage of the SBSW2 applying line from 0V to VPP, the voltage of the SBPD applying line from VSS to VCC.

The voltage of the SBSW2 applying line is transited to the VPP level in the period t4 in advance so that data of logic value "1' can be written in a ferroelectric capacitor in the period t5 by making the voltage of the wordline WL and SBSW2 applying line 2VPP through a self-boost process.

The period t5 is a period for writing the data of logic value "1" in every cell. Back in the period t4, the voltage of the SBSW2 applying line is VPP and the voltage of the SBPU applying line is 0V while the sub bitline SBL comes to float. In the period t5, the voltage of the SBPU applying line is transited to the VPP level and then, the voltage of the sub bitline SBL is also transited to the VPP level while the voltage of the SBSW2 applying line and wordline becomes the 2VPP level by the self-boost process. Accordingly, VPP is delivered to ferroelectric capacitors being provided with a VPP signal of the sub bitline.

Then, in the period t6, a write enable signal /WE is transited from a low level to a high level. The wordline voltage is maintained to 2VPP and the plate line voltage is maintained to VPP. Also, the voltage of the SBSW1 applying line is maintained to VCC, the voltage of the SBSW2 and SBPD applying lines to VSS, and the voltage of the SBPU applying line to VPP.

By the SBSW1 signal, a first switching transistor ST1 is turned on and the data of logic value "0." (VPP) are restored or written in cells. At this instance, the data of logic value "0" are restored in the cells which used to have the data of logic value "0" before among the cells of which data were read in the period t3. In the meantime, the data of logic value "0" are written in the cells selected to store external data of new data having logic value "0".

In this way, the data of logic value "0" (VPP) are delivered to ferroelectric capacitors of particular cells through particular sub bitlines SBL.

In the period t7, the voltage of all the signal lines is maintained to the level prior to the active period, as it was in the period t0.

Figure 9:
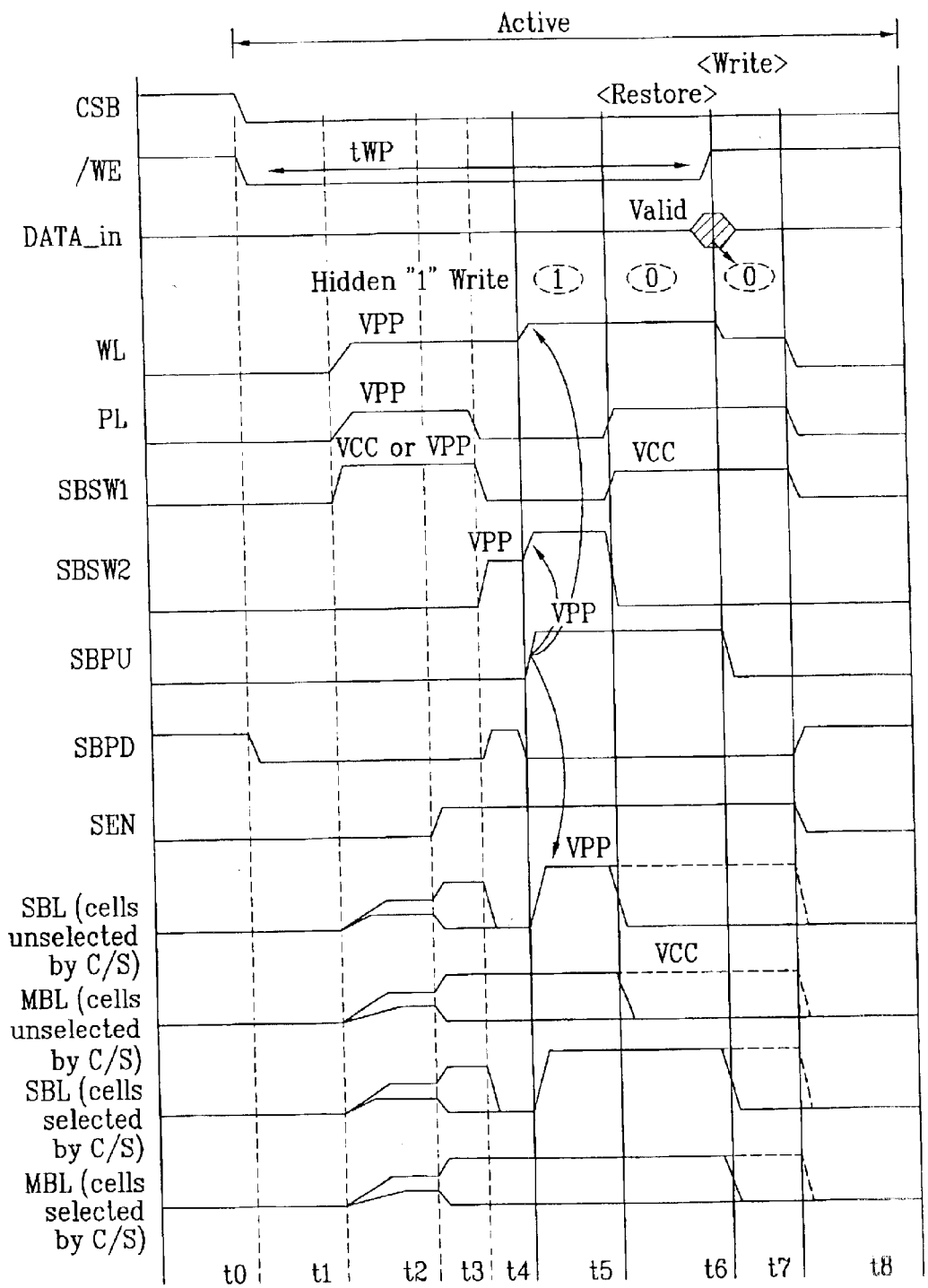
FIG. 9 is a timing diagram illustrating a write mode of the cell array of FIG. 7 during which a write enable signal (/WE) is transited from a low level to a high level in the period t6.

FIG. 9 is a timing diagram illustrating a write mode in which a write enable signal /WE is transited from a low level to a high level after the period t6 or thereafter.

As shown in FIG. 9, during the write mode in which the write enable signal is transited to a high level after the period t6 or thereafter, data of logic value "1" are written in every cell in the period t5. Then, in the period 6, data are restored in the unselected cells and in the period t7, the external data are written in the cells selected by a chip selecting signal.

Referring to FIG. 9, upper sub bitline SBL and main bitline MBL show an operation of the cells not selected by a chip selecting signal C/S while lower sub bitline SBL and main bitline MBL show an operation of the cells selected by the chip selecting signal C/S.

Figure 10:
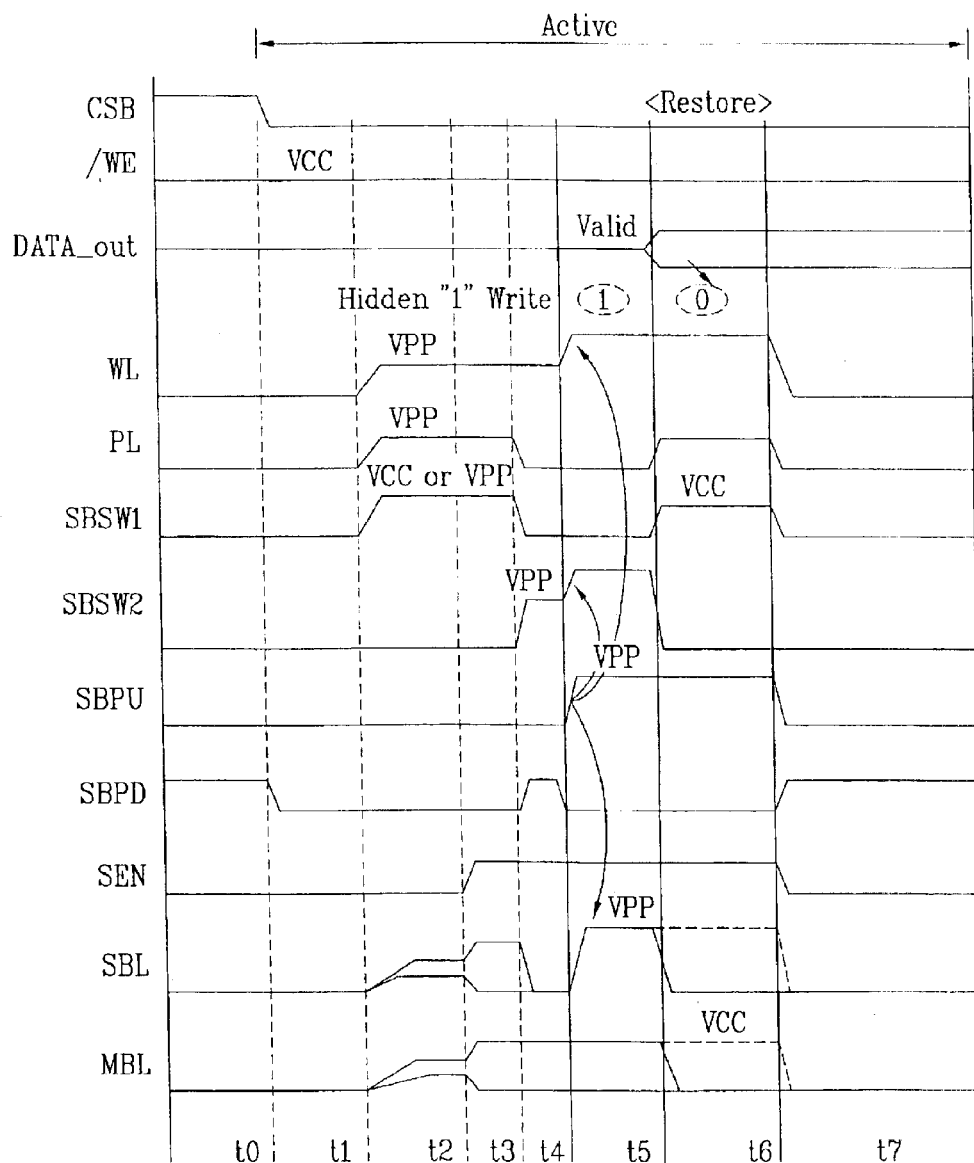
FIG. 10 is a timing diagram illustrating a read mode of the cell array of FIG. 7, the cell array which senses a voltage of bitlines.

FIG. 10 is a timing diagram illustrating a read mode which senses a voltage of a bitline.

In the period t5, data of logic value "1" are written in every cell and in the period t6, data of logic value "0" are restored in cells without any selection process.

Figure 11:
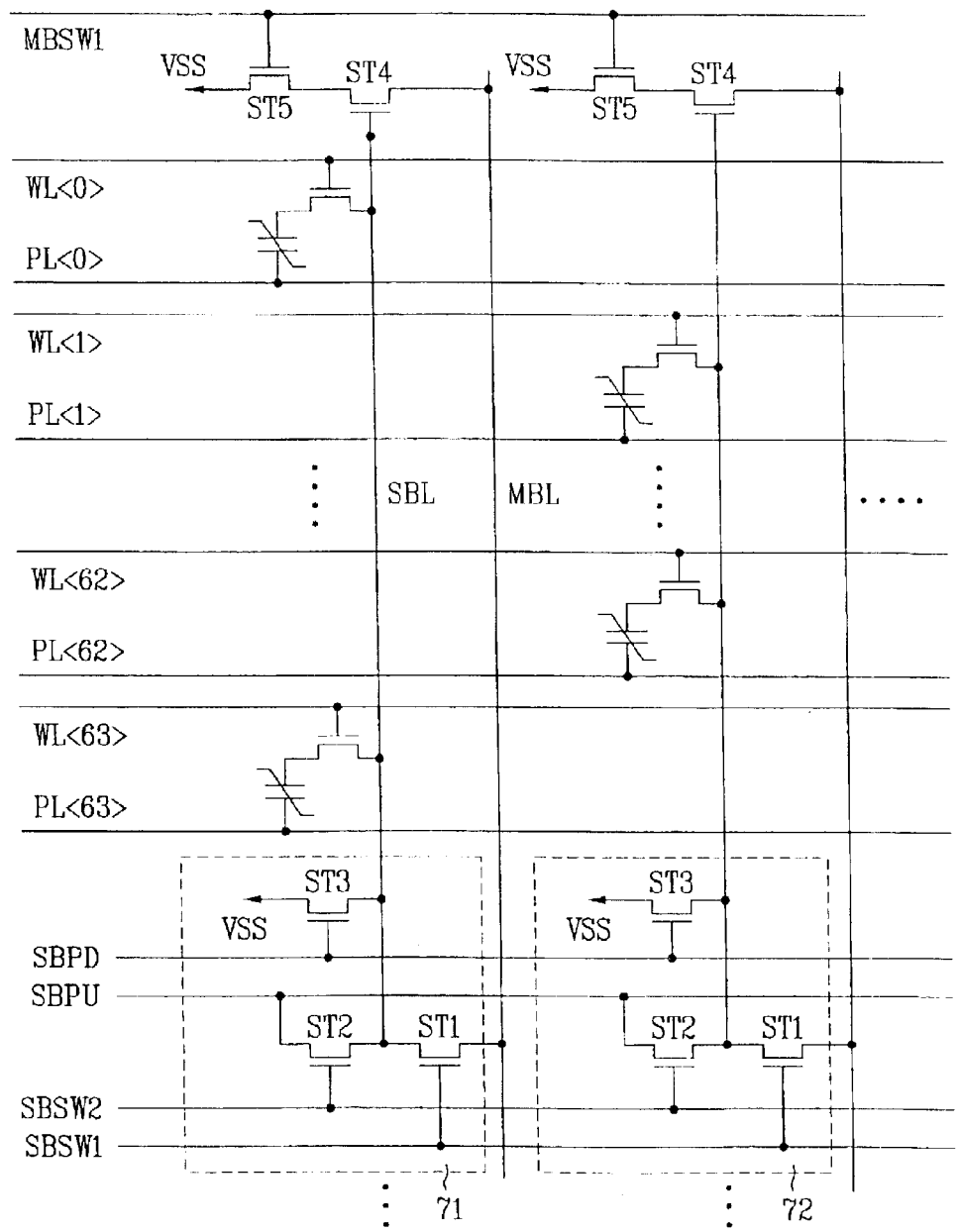
FIG. 11 is a schematic diagram illustrating a structure of a cell array which senses a current of hierarchic bitlines.

FIG. 11 is a schematic diagram illustrating a cell array structure sensing a current of hierarchic bitlines in accordance with the second embodiment of the present invention.

As shown in FIG. 11, a plurality of pairs of a wordline WL and a plate line PL are formed in the same direction and cells being connected to each pair of the wordline and plate line one by one are also formed. A gate of second switching transistors ST2 of switching blocks 71 and 72 is formed and controlled by a second sub bitline switching signal SBSW2 applying line.

A plurality of main bitlines MBL are arranged perpendicular to the wordline WL and plate line PL and a plurality of sub bitlines SBL are arranged in the same direction as the main bitlines MBL so as to be connected to unit cells in each cell array.

Also, the sub cell array includes a sub bitline pull-down signal SBPD applying line, first and second sub bitline switch signal SBSW1 and SBSW2 applying lines, and a sub bitline pull-up signal SBPU applying line. The SBPD applying line is arranged in the same direction as the wordline WL and the plateline PL.

In addition, switching control blocks 71 and 72 are formed corresponding to one main bitline and one sub bitline to decide whether the selected cell is to be connected to the main bitline or to sub bitline and to control a voltage provided to a ferroelectric capacitor of the selected cell. The switching control blocks 71 and 72 themselves are controlled by the applying lines of the SBPD, SBSW1, SBSW2, and SBPU.

The switching control blocks 71 and 72 have first, second, and third switching transistors ST1, ST2, and ST3.

The first switching transistor ST1 has a gate being connected to the SBSW1 applying line and source and drain electrodes being respectively connected to the main bitline, and sub bitilne. The second switching transistor ST2 has a gate being connected to the SBSW2 applying line and source and drain electrodes being respectively connected to the sub bitline and SBPU applying line. The third switching transistor ST3 has a gate being connected to the SBPB applying line and source and drain electrodes being respectively connected to the sub bitilne and a ground voltage terminal VSS.

The switching control blocks 71 and 72 further includes a fourth switching transistor ST4 having a gate being connected to the sub bitline SBL and source and drain electrodes being respectively connected to the main bitline MBL and a groud VSS line. The fourth switching transistor ST4 is arranged on the sub bitline SBL by ones.

A voltage corresponding to the data stored in the cell is provided to the sub bitline of each sub cell array block and then, this voltage is applied to the gate of the fourth switching transistor ST4 through the sub bitline.

Accordingly, a current value of the fourth switching transistor ST4 is differentiated depending on a level of the voltage corresponding to the data stored in the cell. Therefore, the cell data can be sensed by comparing the voltage of the main bitline MBL being connected to the drain terminal of the fourth switching transistor ST4 with the reference value.

Although not shown, one main bitline MBL is selectively connected to a plurality of sub bitlines SBL. For example, when a cell array is defined as an upper sub cell array and a lower sub cell array, one main bitline MBL of a column direction is selectively connected to an upper sub bitline being positioned on the upper cell array or to a lower sub bitline being positioned on the lower sub cell array.

In other words, one sub bitline. SBL is selected as one of the SBSW1 signals, the signals for selecting one sub bitline SBL among plurality of the sub bitlines SBL, is also formed. In this way, load of bitline is reduced to the same level as that of one sub bitline.

Also, the voltage of the sub bitline SBL is adjusted to be the ground voltage level by the activation of the SBPD signal activated by the SBPD applying line.

The SBPU applying line controls a power supply provided to the sub bitline SBL. And, a signal applied to the SBSW1 and SBSW2 applying lines acts as a switch for controlling signals flowing between the SBPU applying line and the sub bitline SBL.

Each sub bitline SBL has a plurality of cells connected thereto.

A fifth switching transistor ST5 having a NMOS transistor is additionally provided to prevent a current leakage when data are written. The fifth switching transistor ST5 has a gate being provided with a main bitline switching signal MBSW1, a drain terminal being connected to the source of the fourth switching transistor ST4, and a source being connected to the ground voltage VSS terminal. The fifth switching transistor ST5 is arranged on the sub bitline SBL by ones.

Figure 12:
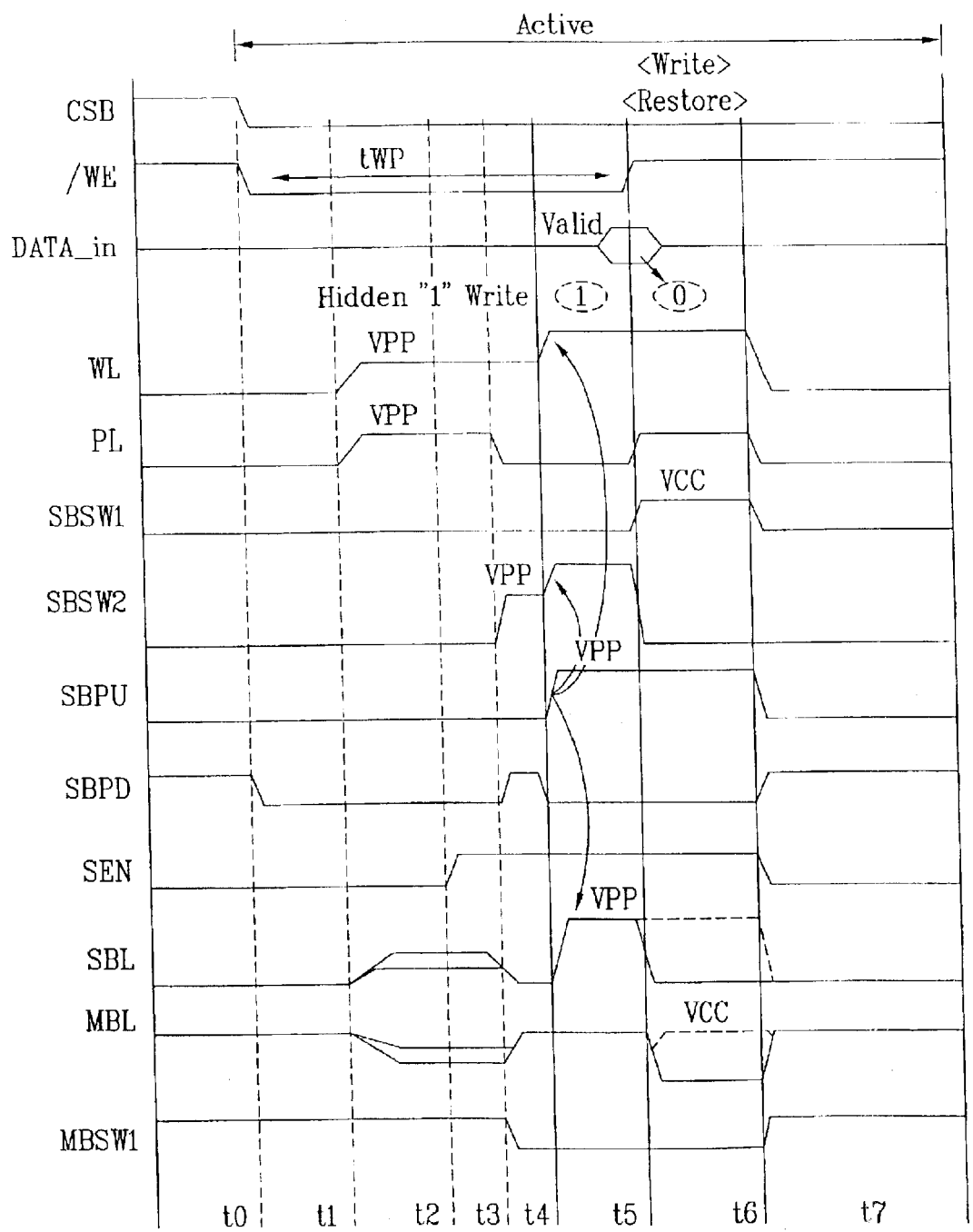
FIG. 12 is a timing diagram illustrating a write mode of the cell array of FIG. 11, during which a write enable signal (/WE) is transited from a low level to a high level in the period t5.

FIG. 12 is a timing diagram illustrating a write mode during which a write enable signal /WE is transited from a low level to a high level in the period t5.

One cycle of a cell operation is defined as an active period and a precharge period. The active period is a period when a chip activating signal CSB is low and the precharge period is a period when the CSB is high. That is, the period to is the precharge period and the periods t1 to t7 are the successive active period.

The operation of a nonvolatile ferroelectric memory device will be described by dividing the whole operation time into eight periods t0 to t7.

As shown in FIG. 12, in the period t0, VCC is applied to a SBPD applying line to make the sub bitline SBL have 0V. At this time, 0V is applied to a wordline WL, a plate line PL, SBSW1 and SBSW2 applying lines, a SBPU applying line, and a SEN applying line. Also, a voltage of a high level is applied to the SBPD applying line and a MBSW1 applying line.

Then, in the period t1, the voltage of the SBPD and CSB applying lines is transited from a high level to a low level while the voltage of the rest signal applying lines is maintained to the same level as that in the period to.

In the period t2, VPP is applied to the wordline WL and plate line PL while the voltage of the rest applying lines is maintained to the same level as that in the period t1. Accordingly, the voltage of the sub bitline SBL becomes high and the voltage of the main bitlint MBL falls to a low level as the fourth switching transistor ST4 is turned on.

In the period t3, the voltage of the wordline WL and plate line PL is maintained to the VPP level and a sense amplifier is enabled by being provided with the VCC voltage. The voltage of the rest signal applying lines is maintained to the same level as that in the period t2.

In the periods t2 and t3, the fourth switching transistor ST4 is turned on and a sensing operation is performed.

Subsequently, in the period t4, the wordline WL voltage is maintained to the VPP level and the plate line PL voltage is transited from VPP to 0V. The voltage of the sub bitline SBL becomes a low level (0V) as 0V is applied to the SBPU applying line and the voltage of the SBSW2 applying line is transited from 0V to VPP.

The voltage of the SBSW2 applying line is transited to the VPP level in the period t4 in advance so that data of logic value "1" can be written in the ferroelectric capacitors of all the unit cells by making the wordline WL and SBSW2 applying line have 2VPP through a self-boost process.

The period t5 is a period for writing the data of logic value "1" in every cell. Back in the period t4, the voltage of the SBSW2 applying line is VPP and the voltage of the SBPU applying lines is 0V while the sub bitline SBL comes to float. When the voltage of the SBPU applying line is transited to the VPP level, the voltage of the sub bitline SBL is also transited to the VPP level. The voltage of the SBSW2 applying line and worline WL becomes the 2VPP level by the self-boost process. At this time, the MBSW1 is transited from a high level to a low level. In this way, VPP is provided to the ferroelectric capacitor of the cell being provided with a VPP signal of the sub bitline SBL.

As described above, the data of logic value "1" is written in every cell in the period t5. Then, in the period t6, external data are written in the cells selected by a chip selecting signal C/S and the other cells which remains unselected are restored. That is, the data of logic value "0" can be written only in the period t6 in which the SBSW1 applying line is activated.

The period t7 is the same state as the period t0.

Figure 13:
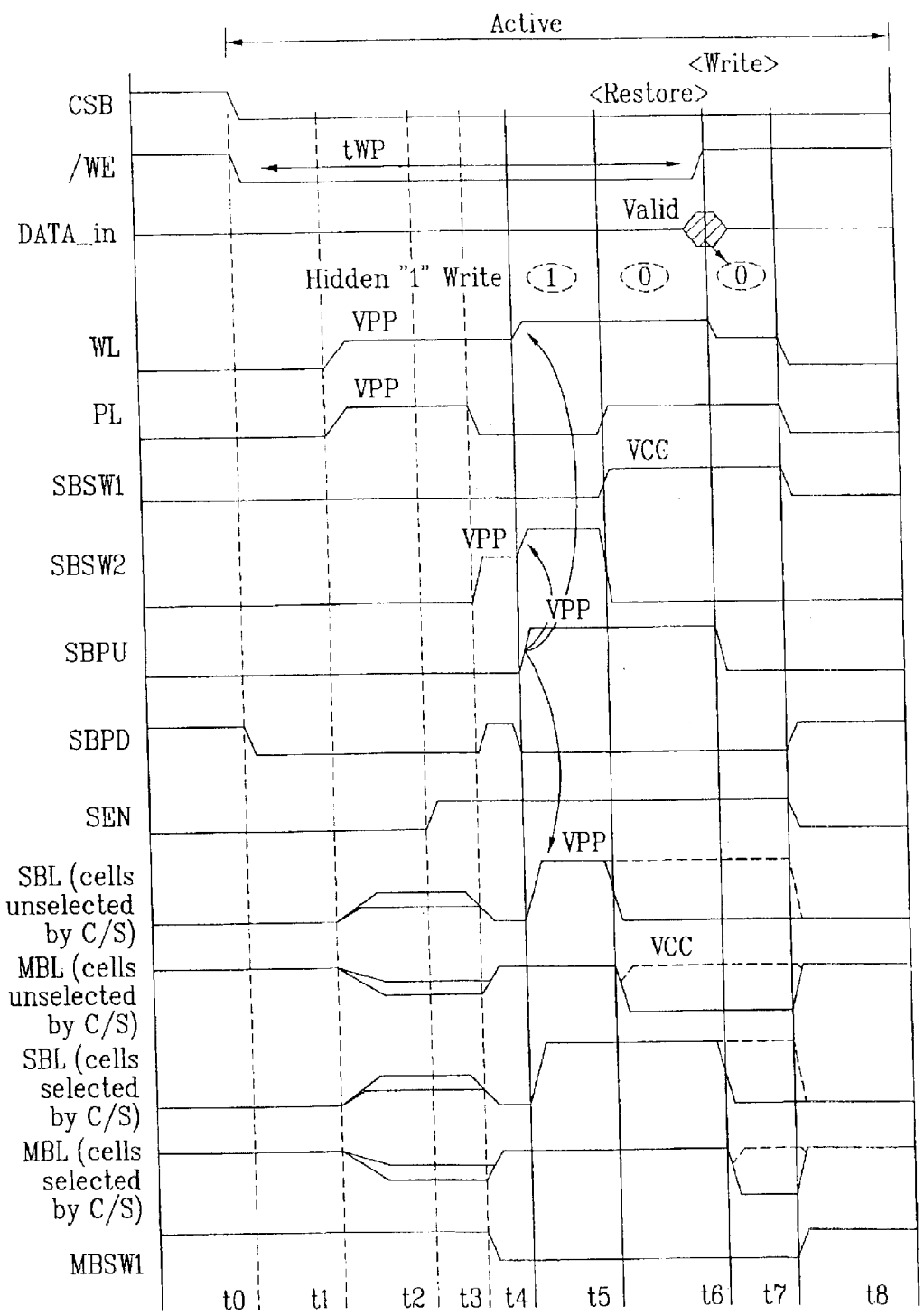
FIG. 13 is a timing diagram illustrating a write mode of the cell array of FIG. 11, during which a write enable signal (/WE) is transited from a low level to a high level in the period t6.

FIG. 13 is a timing diagram illustrating a write mode during which a write enable signal /WE is transited form a low level to a high level in the period t6 or thereafter.

After the data of logic value "1" is written in every cell in the period t5, data of the unselected cells are restored in the period t6. Then, in the period t7, external data are written only in the cells selected by a chip selecting signal C/S.

The SBSW1 applying line being activated only in the periods t6 and t7, in which the data of logic value "0" are written, is used to write the data of logic value "0" in cells.

Referring to FIG. 13, upper sub bitline SBL and main bitline MBL show an operation of cells not selected by a chip selecting signal C/S while lower sub bitline SBL and main bitline MBL show an operation of cells selected by the chip selecting signal C/S.

Figure 14:
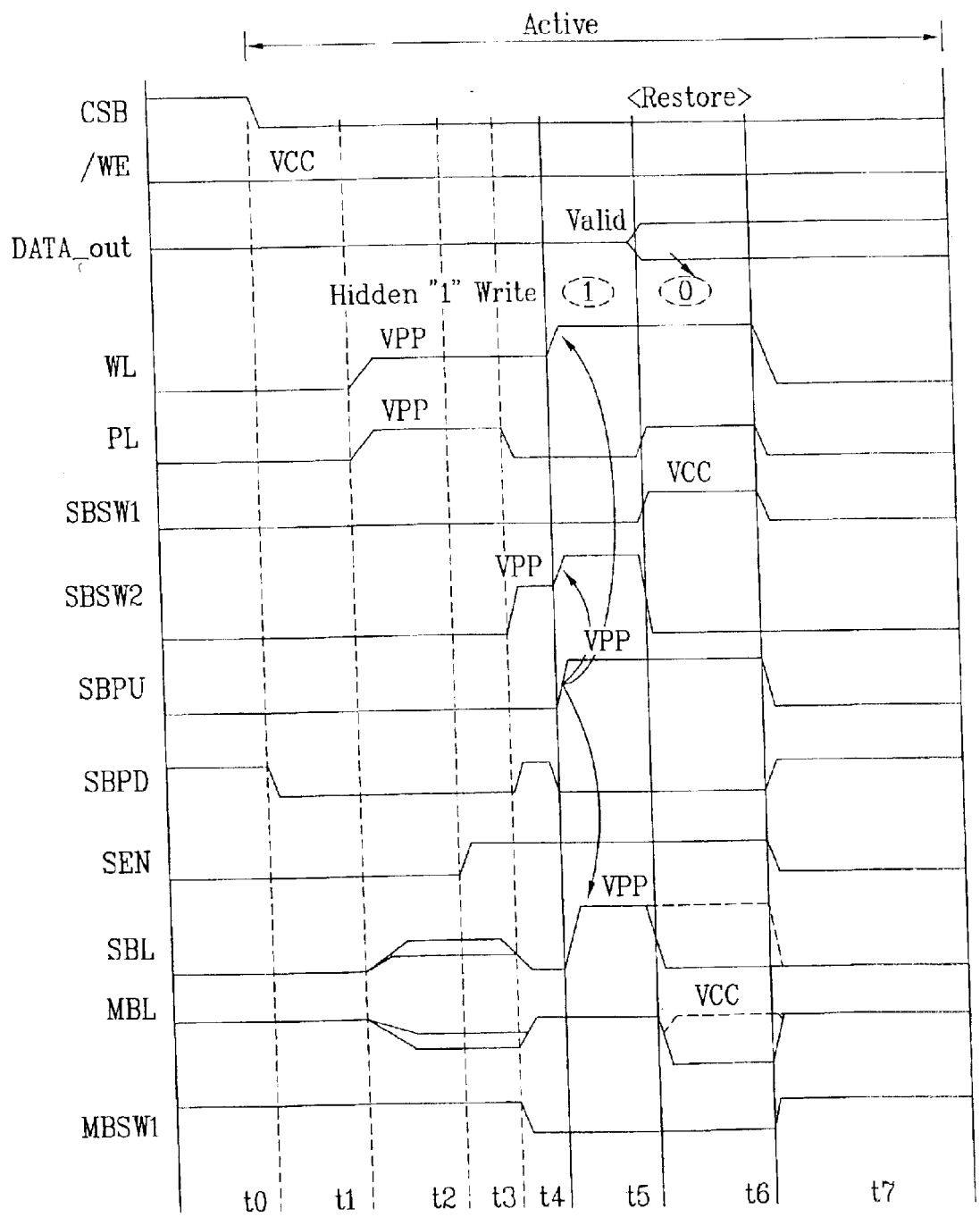
FIG. 14 is a timing diagram illustrating a read mode of the cell array of FIG. 11, the cell array which senses a current of bitlines.

FIG. 14 is a timing diagram illustrating a read mode sensing a current of a bitline.

In the period t5, data of logic value "1" are written in every cell and in the period t6, data of the cells are restored regardless of the cell selection process in the period t6. The SBSW1 applying line being activated only in the period t6, in which the data of logic value "0" are written, is used to write the data of logic value "0" in cells.

Figure 15:
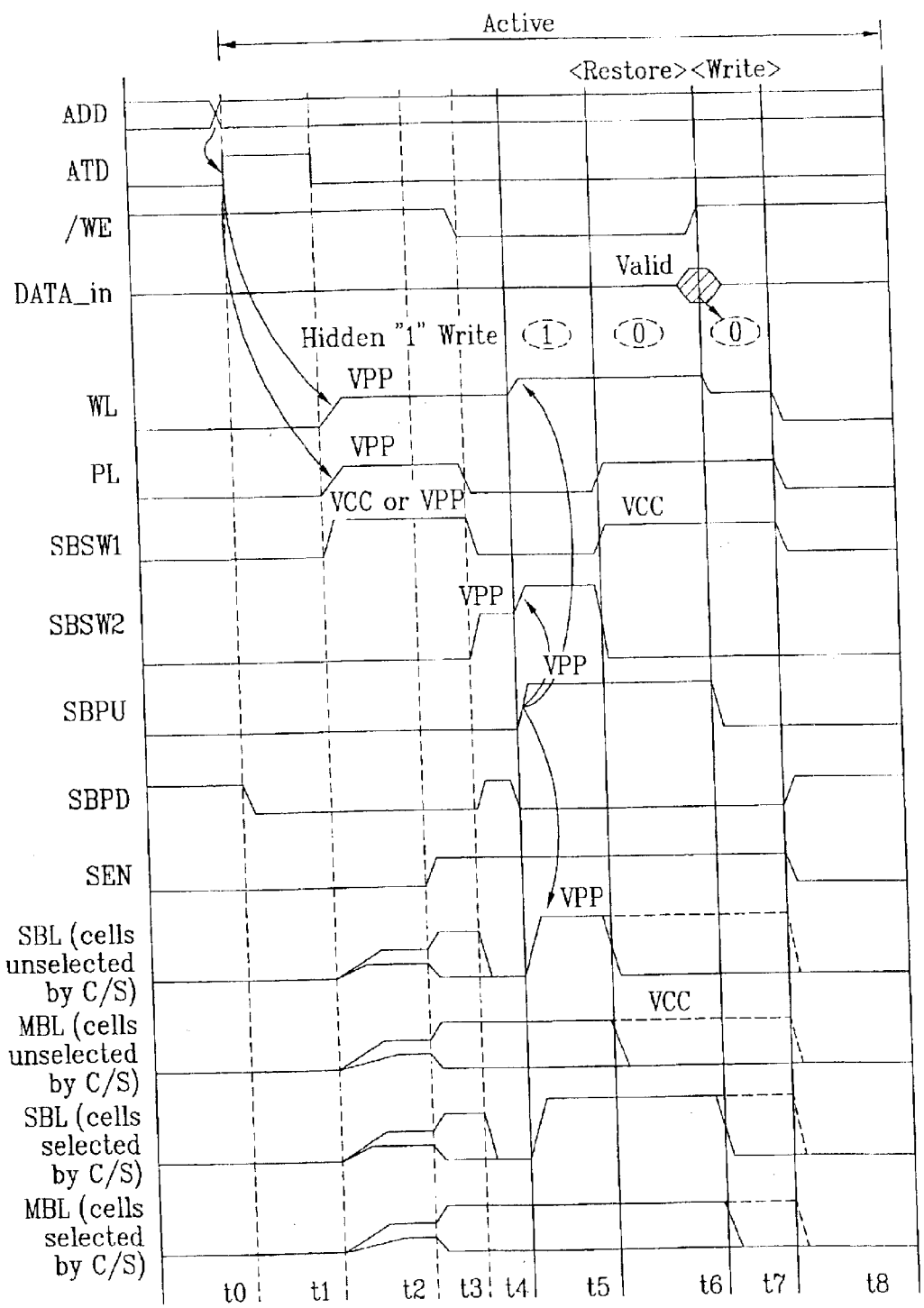
FIGS. 15 and 16 are timing diagrams illustrating a write mode operation of the cell array of FIG. 7, the cell array which senses a voltage of hierarchic bitlines.
Figure 16:
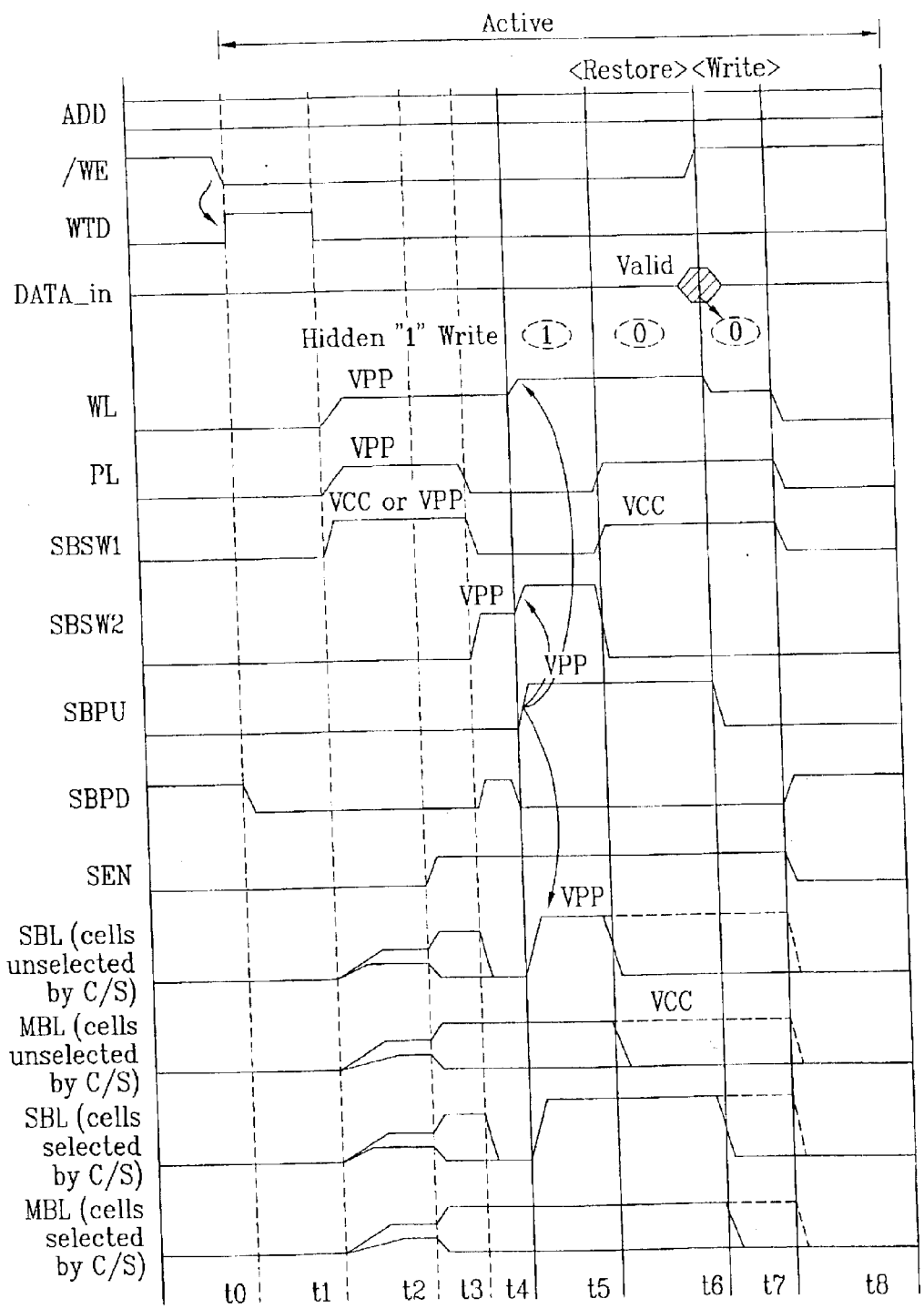

FIGS. 15 and 16 are timing diagrams illustrating a write mode operation of the cell array of FIG. 7, the cell array sensing a voltage of hierarchic bitlines.

FIG. 15 illustrates a write mode operation in which a write enable signal /WE is transited from a high level to a low level after an address being changed within one write cycle.

The write operation is started by an address change detection ATD pulse signal and a write transition detection WTD signal is prevented from being generated until the write operation is completed. That is, the WTD signal being generated when the write enable signal /WE is transited from high to low is not generated unless the previous write cycle is completed. Thus, after the previous write cycle is completed, the write enable signal /WE is transited from high to low, thereby generating the WTD signal.

Referring to FIG. 15, upper sub bitline SBL and main bitline MBL show an operation of cells not selected by a chip selecting signal C/S and lower sub bitline SBL and main bitline MBL show an operation of cells selected by the chip selecting signal C/S.

FIG. 16 illustrates a write mode operation in which a write enable signal /WE is transited from a high level to a low level without any change in an address ADD.

As shown in FIG. 16, a write operation is normally performed using a WTD signal when the WTD signal is generated.

Referring to FIG. 16, upper sub bitline, SBL and main bitline MBL show an operation of cells not selected by a chip selecting signal C/S and lower sub bitline SBL and main bitline MBL show an operation of cells selected by the chip selecting signal C/S.

Figure 17:
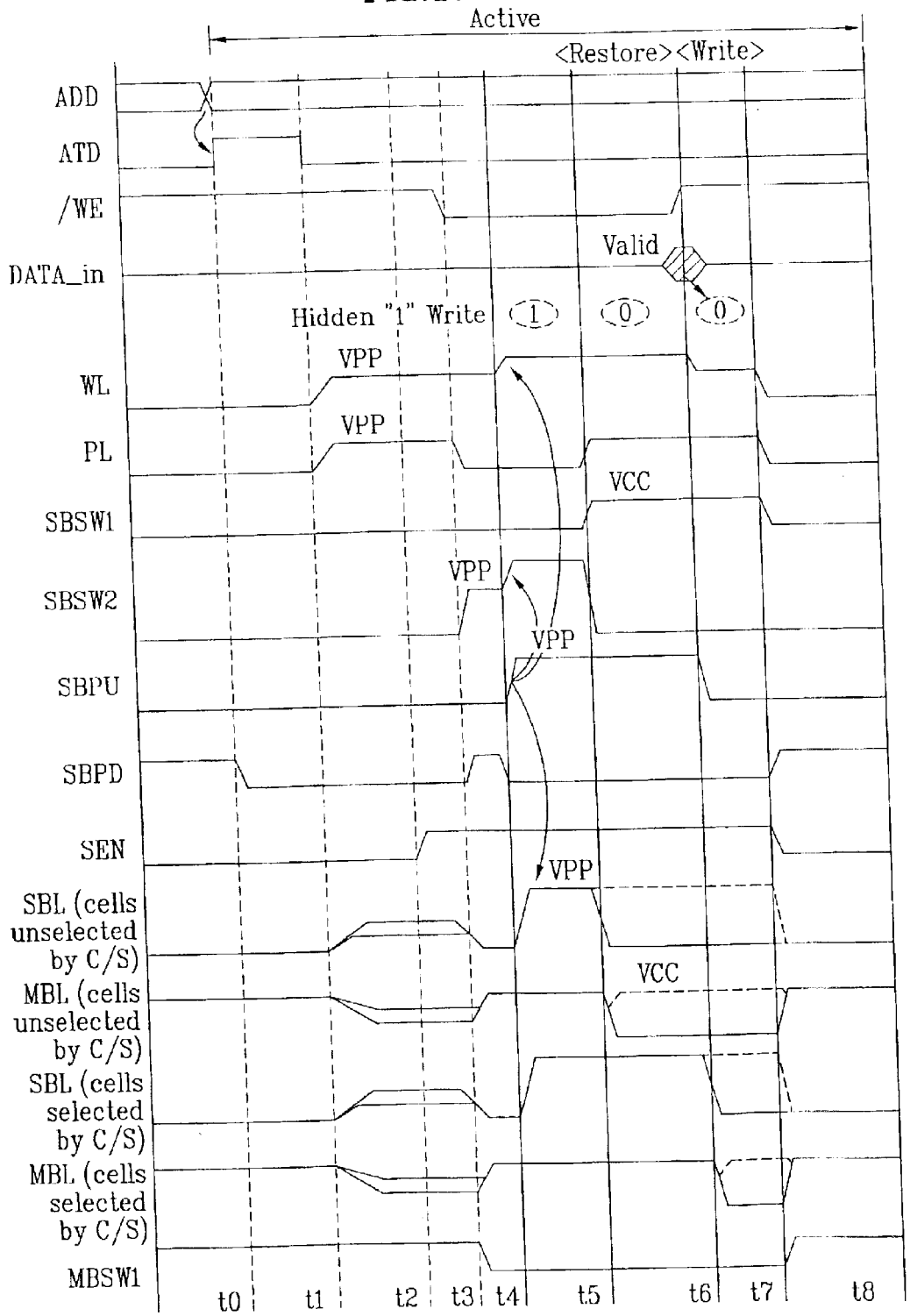
FIGS. 17 and 18 are timing diagrams illustrating a write mode operation of the cell array of FIG. 11, the cell array which senses a current of hierarchic bitlines.
Figure 18:
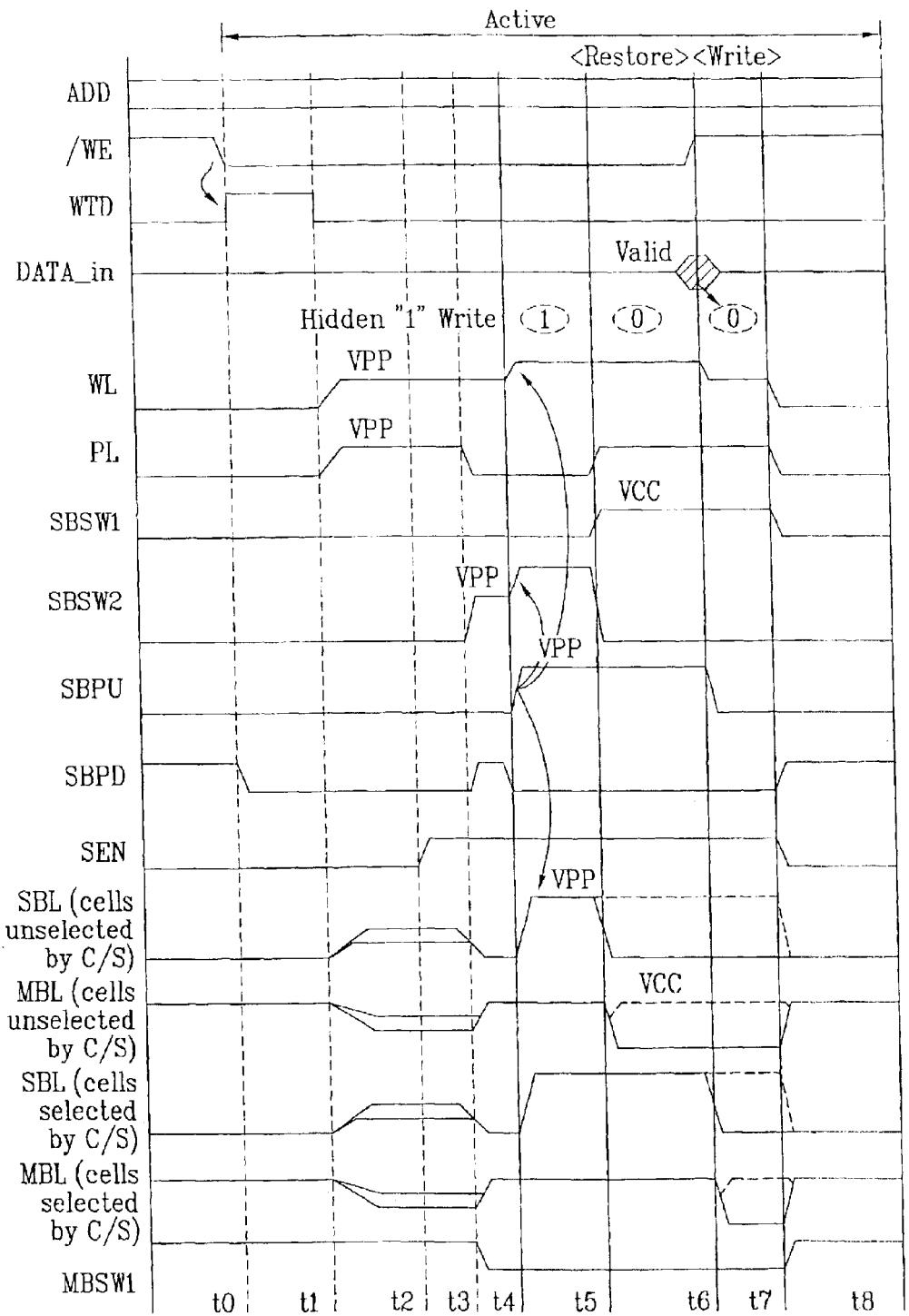

FIGS. 17 and 18 are timing diagrams illustrating a write mode operation of the cell array of FIG. 11, the cell array sensing a current of a hierarchic bitline.

FIG. 17 illustrates a write mode in which a write enable signal /WE is transited from a high level to a low level after an address is changed within one write cycle.

The write operation is started by an address change detection ATD pulse signal and a write transition detection WTD signal is prevented from being generated until the write operation is completed. That is, the WTD signal being generated when the write enable signal /WE is transited from high to low is not generated unless the previous write cycle is completed. Thus, after the previous write cycle is completed, the write enable signal /WE is transited from high to low, thereby generating the WTD signal.

FIG. 18 illustrates a write mode in which a write enable signal /WE is transited from a high level to a low level without any address change.

As shown in FIG. 18, a write operation is normally performed by a WTD signal.

Referring to FIG. 18, upper sub bitline SBL and main bitline MBL show an operation of cells not selected by a chip selecting signal C/S and lower sub bitline SBL and main bitline MBL show an operation of cells selected by the chip selecting signal C/S.

Figure 19:
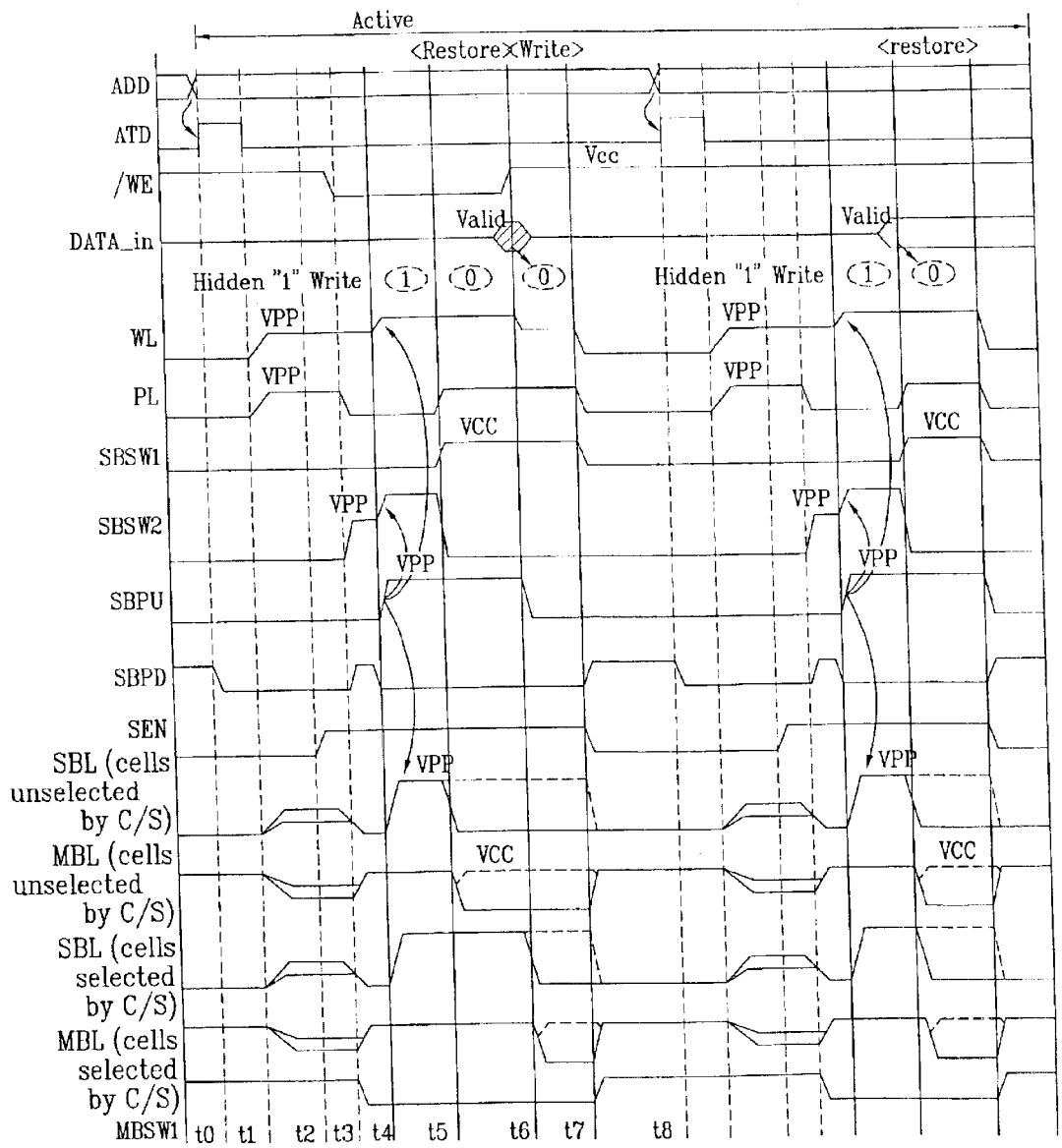
FIG. 19 is a timing diagram illustrating a write/read cycle.

FIG. 19 is a timing diagram illustrating a write/read cycle.

As shown in FIG. 19, within one cycle, an address is firstly changed and then, a write enable signal /WE is transited from a high level to a low level.

The write operation is started by an address change detection ATD pulse signal and a write transition detection WTD signal is prevented from being generated until the write operation is completed. That is, the WTD signal being generated when the write enable signal /WE is transited from high to low is not generated unless the previous write cycle is completed. Thus, after the previous write cycle is completed, the write enable signal /WE is transited from high to low and the WTD signal is generated.

In the period t7, the write enable signal /WE is transited from low to high without any address change. That is, the change from the write operation to the read operation in the same address is done by the write enable signal /WE without any address ADD changes.

Referring to FIG. 19, upper sub bitline SBL and main bitline MBL show an operation of cells not selected by a chip selecting signal C/S and lower sub bitline SBL and main bitline MBL show an operation of cells selected by the chip selecting signal C/S.

A nonvolatile ferroelectric memory device of the present invention has the following advantages.

First, in the nonvolatile ferroelectric memory device of the present invention, a write mode and a read mode are separately operated by a cell array. Also, during the write mode as well, cells for operating the write mode and cells for operating only the read mode are classified to be separately operated. Accordingly, even if a power supply is cut in the active period, data can normally be restored in the cells in which the read operation was performed.

Also, in the nonvolatile ferroelectric memory device of the present invention, during the read and write modes, data are restored in the cells of which data were read in an active period, without waiting until a precharge period starts. Therefore, the read access time is saved as the data can be read or restored in the active period during the operation of the read or write mode.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A nonvolatile ferroelectric memory device, comprising:
   a cell array block having a plurality of unit cells being controlled by plate lines and wordlines;
   a plate line driver being positioned on one side of the cell array block to apply a driving signal to the plate lines;
   a wordline driver being positioned on the other side of the cell array block to apply a driving signal to the wordlines;
   a plurality of sub bitlines and main bitlines being arranged on the cell array block in the same direction; and
   switching control blocks controlling signals applied to the sub bitlines and main bitlines, said switching control blocks including
      a first switching transistor controlling the connection between the sub bitline and the main bitline;
      a second switching transistor controlling pull-up of the sub bitline; and
      a third switching transistor controlling pull-down of the sub bitline.

2. The device of claim 1, wherein the wordline driver includes:
   a NAND gate logically calculating a plurality of X-address signals;
   a NOR gate logically calculating an output signal of the NAND gate and a first wordline control signal;
   a first NMOS transistor having a source being provided with an output signal of the NOR gate, a gate being provided with a second wordline control signal, and a drain acting as an output terminal;
   a second NMOS transistor having a gate being connected to the drain of the first NMOS transistor, a source being provided with a third wordline control signal, and a drain being connected to the wordline; and
   a third NMOS transistor having a source being connected to the wordline along with the second NMOS transistor, a gate being provided with an output signal of the NAND gate, and a drain being connected to a ground terminal.

3. The device of claim 2, wherein the wordline is controlled according to a voltage level of the first wordline control signal.

4. The device of claim 1, wherein the wordline driver includes:
   a first NAND gate logically calculating a plurality of X-address signals; an inverter reversing an output signal of the first NAND gate;
   a first NMOS transistor having a source being provided with an output signal of the inverter, a gate being provided with a first wordline control signal, and a drain acting as an output terminal;
   a second NMOS transistor having a gate being connected to the drain of the first NMOS transistor, a source being provided with a second wordline control signal, and a drain being connected to the wordline;
   a second NAND gate logically calculating an output signal of the inverter and an external pull-down control signal; and
   a third NMOS transistor having a source being connected to the wordline along with the drain of the second NMOS transistor, a gate being provided with an output signal of the second NAND gate, and a drain being connected to a ground terminal.

5. The device of claim 4, wherein the wordline is controlled according to a voltage level of the first wordline control signal.

6. The device of claim 1, further comprising a fourth switching transistor having a gate being connected to the sub bitline, a drain being connected to the main bitline, and a source being connected to the ground terminal.

7. A method for driving a nonvolatile ferroelectric memory device, comprising:
   a NAND gate logically calculating a plurality of X-address signals; a NOR gate logically calculating an output signal of the NAND gate and a first wordline control signal;
   a first NMOS transistor having a source being provided with an output signal of the NOR gate, a gate being provided with a second wordline control signal, and a drain acting as an output terminal;
   a second NMOS transistor having a gate being connected to the drain of the first NMOS transistor, a source being provided with a third wordline control signal, and a drain being connected to wordline; and
   a third NMOS transistor having a source being connected to the wordline along with the second NMOS transistor, a gate being provided with an output signal of the NAND gate, and a drain being connected to a ground terminal, wherein the wordline is controlled by the first wordline control signal.

8. The method of claim 7, wherein the wordline comes to float by the first wordline control signal of a high level.

9. The method of claim 7, wherein the first NMOS transistor comes to have the same output value as that of the NOR gate when a level of the second wordline control signal increases to the VPP level.

10. The method of claim 7, wherein an output voltage loss of the first NMOS transistor is prevented by the second wordline control signal when an output value of the first NMOS transistor becomes the VCC level in a predetermined period.

11. The method of claim 7, wherein an output voltage of the first NMOS transistor increases from the VCC level to a VPP and higher level by the third wordline control signal when an output value of the first NMOS transistor becomes the VCC level.

12. A nonvolatile ferroelectric memory device, comprising:
a cell array block having a plurality of unit cells being controlled by plate lines and wordlines;
a plate line driver being positioned on one side of the cell array block to apply a driving signal to the plate lines;
a wordline driver being positioned on the other side of the cell array block to apply a driving signal to the wordlines, said the wordline driver including,
a NAND gate logically calculating a plurality of X-address signals;
a NOR gate logically calculating an output signal of the NAND gate and a first wordline control signal;
a first NMOS transistor having a source being provided with an output signal of the NOR gate, a gate being provided with a second wordline control signal, and a drain acting as an output terminal;
a second NMOS transistor having a gate being connected to the drain of the first NMOS transistor, a source being provided with a third wordline control signal, and a drain being connected to the wordline; and
a third NMOS transistor having a source being connected to the wordline along with the second NMOS transistor, a gate being provided with an output signal of the NAND gate, and a drain being connected to a ground terminal;
a plurality of sub bitlines and main bitlines being arranged on the cell array block in the same direction; and
switching control blocks controlling signals applied to the sub bitlines and main bitlines.

13. The device of claim 12, wherein the wordline is controlled according to a voltage level of the first wordline control signal.

14. The device of claim 12, further comprising:
an inverter reversing an output signal of said NAND gate; and
an additional NAND gate logically calculating an output signal of the inverter and an external pull-down control signal.

* * * * *